United States Patent
Choi et al.

(10) Patent No.: US 7,875,486 B2
(45) Date of Patent: Jan. 25, 2011

(54) SOLAR CELLS AND METHODS AND APPARATUSES FOR FORMING THE SAME INCLUDING I-LAYER AND N-LAYER CHAMBER CLEANING

(75) Inventors: Soo Young Choi, Fremont, CA (US); Liwei Li, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 272 days.

(21) Appl. No.: 12/170,387

(22) Filed: Jul. 9, 2008

(65) Prior Publication Data
US 2009/0093080 A1   Apr. 9, 2009

Related U.S. Application Data

(60) Provisional application No. 60/958,904, filed on Jul. 10, 2007.

(51) Int. Cl.
*H01L 21/00* (2006.01)
(52) U.S. Cl. .................. 438/57; 438/96; 438/906; 257/E21.002
(58) Field of Classification Search .......... 438/57, 438/96, 97, 906; 257/E21.002
See application file for complete search history.

(56) References Cited

U.S. PATENT DOCUMENTS

| | | |
|---|---|---|
| 3,990,101 A | 11/1976 | Ettenberg et al. |
| 4,063,735 A | 12/1977 | Wendel |
| 4,068,043 A | 1/1978 | Carr |
| 4,377,723 A | 3/1983 | Dalal |
| 4,388,482 A | 6/1983 | Hamakawa et al. |
| 4,400,577 A | 8/1983 | Spear |

(Continued)

FOREIGN PATENT DOCUMENTS

EP    0 994 515 A2    4/2000

(Continued)

OTHER PUBLICATIONS

O. Vetterl, et al "Preparation Temperature Effects in Microcrystalline Silicon Thin Film Solar Cells", Mat. Res. Soc. Symp. Proc. vol. 664 p. A 25.8.1-A 25.8.6, 2001.

(Continued)

*Primary Examiner*—Michael Trinh
(74) *Attorney, Agent, or Firm*—Patterson & Sheridan, LLP

(57) ABSTRACT

Embodiments of the present invention generally provide an apparatus and method for forming an improved thin film single or multi-junction solar cell in a substrate processing device. One embodiment provides a system that contains at least one processing chamber that is adapted to deposit one or more layers that form a portion of a solar cell device. In one embodiment, a method is employed to reduce the contamination of a substrate processed in the processing chamber by performing a cleaning process on the inner surfaces of the processing chamber prior to depositing the one or more layers on a substrate. The cleaning process may include depositing a layer, such as a seasoning layer or passivation layer, that tends to trap contaminants found in the processing chamber. Other embodiments of the invention may provide scheduling and/or positioning the cleaning processing steps at desirable times within a substrate processing sequence to improve the overall system substrate throughput.

18 Claims, 11 Drawing Sheets

U.S. PATENT DOCUMENTS

| | | | |
|---|---|---|---|
| 4,471,155 A | 9/1984 | Mohr et al. | |
| 4,476,346 A | 10/1984 | Tawada et al. | |
| 4,490,573 A | 12/1984 | Gibbons | |
| 4,728,370 A | 3/1988 | Ishii et al. | |
| 4,737,196 A | 4/1988 | Yukimoto | |
| 4,755,475 A | 7/1988 | Kiyama et al. | |
| 4,776,894 A | 10/1988 | Watanabe et al. | |
| 4,841,908 A | 6/1989 | Jacobson et al. | |
| 4,878,097 A | 10/1989 | Yamazaki et al. | |
| 4,891,330 A | 1/1990 | Guha et al. | |
| 5,021,100 A | 6/1991 | Ishihara et al. | |
| 5,032,884 A | 7/1991 | Yamagishi et al. | |
| 5,114,498 A | 5/1992 | Okamoto et al. | |
| 5,252,142 A | 10/1993 | Matsuyama et al. | |
| 5,256,887 A | 10/1993 | Yang et al. | |
| 5,419,783 A | 5/1995 | Noguchi et al. | |
| 5,589,008 A | 12/1996 | Keppner | |
| 5,677,236 A | 10/1997 | Saitoh et al. | |
| 5,700,467 A | 12/1997 | Shima et al. | |
| 5,730,808 A | 3/1998 | Yang et al. | |
| 5,738,731 A | 4/1998 | Shindo et al. | |
| 5,738,732 A | 4/1998 | Nakamura et al. | |
| 5,797,998 A | 8/1998 | Wenham et al. | |
| 5,913,986 A | 6/1999 | Matsuyama | |
| 5,927,994 A | 7/1999 | Kohda et al. | |
| 5,942,050 A | 8/1999 | Green et al. | |
| 5,977,476 A | 11/1999 | Guha et al. | |
| 6,100,466 A | 8/2000 | Nishimoto | |
| 6,121,541 A | 9/2000 | Arya | |
| 6,180,870 B1 | 1/2001 | Sano et al. | |
| 6,190,932 B1 | 2/2001 | Yoshimi et al. | |
| 6,200,825 B1 | 3/2001 | Yoshimi et al. | |
| 6,222,115 B1 | 4/2001 | Nakanishi | |
| 6,242,686 B1 | 6/2001 | Kishimoto et al. | |
| 6,265,288 B1 | 7/2001 | Okamoto et al. | |
| 6,288,325 B1 | 9/2001 | Jansen et al. | |
| 6,297,443 B1 | 10/2001 | Nakajima et al. | |
| 6,307,146 B1 | 10/2001 | Takeuchi et al. | |
| 6,309,906 B1 | 10/2001 | Meier et al. | |
| 6,326,304 B1 | 12/2001 | Yoshimi et al. | |
| 6,337,224 B1 | 1/2002 | Okamoto et al. | |
| 6,380,480 B1 | 4/2002 | Norimatsu et al. | |
| 6,395,973 B2 | 5/2002 | Fujisawa et al. | |
| 6,444,277 B1 | 9/2002 | Law et al. | |
| 6,459,034 B2 | 10/2002 | Muramoto et al. | |
| 6,566,159 B2 | 5/2003 | Sawada et al. | |
| 6,602,606 B1 | 8/2003 | Fujisawa et al. | |
| 6,632,993 B2 | 10/2003 | Hayashi et al. | |
| 6,645,573 B2 | 11/2003 | Higashikawa et al. | |
| 6,700,057 B2 | 3/2004 | Yasuno | |
| 6,750,394 B2 | 6/2004 | Yamamoto et al. | |
| 6,777,610 B2 | 8/2004 | Yamada et al. | |
| 6,825,104 B2 | 11/2004 | Horzel et al. | |
| 6,825,408 B2 | 11/2004 | Nagano et al. | |
| 6,989,553 B2 | 1/2006 | Yokogawa et al. | |
| 7,030,413 B2 | 4/2006 | Nakamura et al. | |
| 7,064,263 B2 | 6/2006 | Sano et al. | |
| 7,071,018 B2 | 7/2006 | Mason et al. | |
| 7,074,641 B2 | 7/2006 | Kondo et al. | |
| 7,235,810 B1 | 6/2007 | Yamazaki et al. | |
| 7,238,545 B2 | 7/2007 | Yoshimi et al. | |
| 7,256,140 B2 | 8/2007 | Call et al. | |
| 7,309,832 B2 | 12/2007 | Friedman et al. | |
| 7,332,226 B2 | 2/2008 | Fujisawa et al. | |
| 7,351,993 B2 | 4/2008 | Atanackovic | |
| 7,375,378 B2 | 5/2008 | Manivannan et al. | |
| 7,402,747 B2 | 7/2008 | Sugawara et al. | |
| 2001/0035206 A1 | 11/2001 | Inamasu et al. | |
| 2001/0051388 A1 | 12/2001 | Shiozaki et al. | |
| 2002/0033191 A1 | 3/2002 | Kondo et al. | |
| 2002/0066478 A1 | 6/2002 | Hayashi et al. | |
| 2003/0013280 A1 | 1/2003 | Yamanaka | |
| 2003/0041894 A1 | 3/2003 | Sverdrup et al. | |
| 2003/0044539 A1 | 3/2003 | Oswald | |
| 2003/0104664 A1 | 6/2003 | Kondo et al. | |
| 2004/0082097 A1 | 4/2004 | Lohmeyer et al. | |
| 2004/0187914 A1 | 9/2004 | Matsuda et al. | |
| 2004/0231590 A1 | 11/2004 | Ovshinsky | |
| 2005/0115504 A1 | 6/2005 | Ueda et al. | |
| 2005/0173704 A1 | 8/2005 | Saito et al. | |
| 2005/0189012 A1 | 9/2005 | Kondo et al. | |
| 2005/0251990 A1 | 11/2005 | Choi et al. | |
| 2005/0284517 A1 | 12/2005 | Shinohara | |
| 2006/0038182 A1 | 2/2006 | Rogers et al. | |
| 2006/0060138 A1 | 3/2006 | Keller et al. | |
| 2006/0169317 A1 | 8/2006 | Sato et al. | |
| 2006/0249196 A1 | 11/2006 | Shima | |
| 2006/0283496 A1 | 12/2006 | Okamoto et al. | |
| 2007/0039942 A1 | 2/2007 | Leung et al. | |
| 2007/0137698 A1 | 6/2007 | Wanlass et al. | |
| 2007/0151596 A1 | 7/2007 | Nasuno et al. | |
| 2007/0227579 A1 | 10/2007 | Buller et al. | |
| 2007/0249898 A1 | 10/2007 | Otawara | |
| 2007/0281090 A1* | 12/2007 | Kurita et al. | 427/255.7 |
| 2007/0298590 A1 | 12/2007 | Choi et al. | |
| 2008/0047599 A1 | 2/2008 | Buller et al. | |
| 2008/0047603 A1 | 2/2008 | Krasnov | |
| 2008/0057220 A1 | 3/2008 | Bachrach et al. | |
| 2008/0110491 A1 | 5/2008 | Buller et al. | |
| 2008/0118663 A1* | 5/2008 | Choi et al. | 427/579 |
| 2008/0153280 A1 | 6/2008 | Li et al. | |
| 2008/0156370 A1 | 7/2008 | Abdallah et al. | |
| 2008/0160661 A1 | 7/2008 | Henley | |
| 2008/0173350 A1 | 7/2008 | Choi et al. | |
| 2008/0185036 A1 | 8/2008 | Sasaki et al. | |
| 2008/0188033 A1 | 8/2008 | Choi et al. | |
| 2008/0196761 A1 | 8/2008 | Nakano et al. | |
| 2009/0020154 A1 | 1/2009 | Sheng et al. | |

FOREIGN PATENT DOCUMENTS

| | | |
|---|---|---|
| EP | 1 650 811 | 4/2006 |
| JP | 4063735 | 2/1992 |
| JP | 4068043 | 3/1992 |
| JP | 11-87742 | 3/1999 |
| JP | 2000-252493 A | 9/2000 |
| JP | 2000252496 | 9/2000 |
| JP | 2004/071716 | 3/2004 |
| JP | 2004/296652 | 10/2004 |
| JP | 2005-135986 | 5/2005 |
| JP | 2006-269607 A | 10/2006 |
| JP | 2006-310694 | 11/2006 |
| JP | 2006-319068 | 11/2006 |
| JP | 2007-035914 | 2/2007 |
| JP | 2007-305826 | 11/2007 |
| JP | 2008/181965 | 8/2008 |
| KR | 20060067919 | 6/2006 |
| WO | WO 03/065462 | 8/2003 |
| WO | WO 2007/118252 | 10/2007 |
| WO | WO2007 149945 | 12/2007 |

OTHER PUBLICATIONS

Stefan Klein, et al. "Microcrystalline Silicon Prepared by Hot-Wire Chemical Vapor Deposition for Thin Film Solar Cell Applications", Jpn J. Appl. Phys. vol. 41(2002)pp. L 10-12, Jan. 2002.

S. Klein, et al "High Efficiency Thin Film Solar Cells with Intrinsic Microcrystalline Silicon Prepared by Hot Wire CVD" Mat. Res. Soc. Symp. Proc. vol. 715 @ 2002 Materials Research Society, pp. A26. 2.1-A 26.2.6.

Ujjwal K. Das et al "Amorphous and Microcrystalline silicon Solar Cells Grown by Pulsed PECVD Technique", Mat. Res. Soc. Symp. Proc. vol. 715 @ 2002 Materials Research Society pp. A. 26.6.1-A 26.6.6.

International Search Report and Written Opinion of PCT/US07/71703, dated Dec. 6, 2007.

PCT Search Report and Written Opinion for PCT/US08/59274, Aug. 26, 2008, consists of 9 unnumbered pages.

PCT Search Report and Written Opinion for PCT/US08/70900, Oct. 14, 2008, consists of 13 pages.

International Search Report and Written Opinion dated Jun. 27, 2008 for International Application No. PCT/US08/50770.

Rech et al. "Amorphous and Microcrystalline Silicon Solar Cells Prepared at High Deposition Rates Using RF (13.56MHz) Plasma Excitation Frequencies." Solar Energy Materials & Solar Cells 66 (2001), pp. 267-273.

Platz, et al. "H2-Dilution VS. Buffer Layers for Increased Voc." Insistut de Microtechnique, Universite de Neuchatel, Rue A-L. Breguet 2, CH-2000 Neuchatel, Switzerland, 6pp.

D.Das, et al. "Characterization of Undoped μc-SiO:H films prepared from (SiH4 + CO2 + H2)—plasma in RF glow discharge, Solar Energy Materials & Solar Cells 63" (2000), pp. 285-297.

A. Lambertz, et al. "Microcrystalline silicone oxide as intermediate reflector for thin film silicon solar cells", 22nd European Photovoltaic Solar Energy Conference, Sep. 3-7, 2007, Milan, Italy, pp. 1839-1842.

Buehlmann, et al. "In situ silicon oxide based intermediate reflector for thin-film silicon micromorph solar cells", Applied Physics Letters 91, 143505 (2007).

K. Yamamoto, et al. "A Thin-Film Silicon Solar Cell and Module, Progress in Photovoltaics: Research and Applications". 2005, 13, pp. 489-494.

Office Action U.S. Appl. No. 11/876,173. Dated Feb. 20, 2009.

Office Action U.S. Appl. No. 11/426,127. Dated Jan. 6, 2009.

International Search Report. Oct. 3, 2008, PCT/US2008/069685, 1 page.

Shah article, "Thin-Film Silicon Solar Cell Technology." Prog. Photovolt: Res. Appl. 2004; 12:113-142.

Freiesleben, et al. "Photovoltaic Solar Energy Conference," Proceedings of the International Conference, Oct. 23-27, 1995.

Lukas Andreas Feiknecht. "Microcrystalline Silicon Solar Cells in the N-I-P Configuration: Optimisations on Light Scattering Back-Reflectors," Sep. 25, 2003.

Veprek, et al. "Properties of microcrystalline silicon. IV. Electrical conductivity, electron spin resonance and the effect of gas adsorption". Issue 32. Nov. 20, 1983.

Zhu, et al. "A Wide Band Gap Boron-doped Microcrystalline Silicon Film Obtained with VHF Glow Discharge Method," 2005.

* cited by examiner

SOLAR CELLS AND METHODS AND APPARATUSES FOR FORMING THE SAME INCLUDING I-LAYER AND N-LAYER CHAMBER CLEANING

CROSS-REFERENCE TO RELATED APPLICATIONS

This application claims benefit of U.S. provisional patent application Ser. No. 60/958,904, filed Jul. 10, 2007, which is herein incorporated by reference.

BACKGROUND OF THE INVENTION

1. Field of the Invention

The present invention generally relates to solar cells and methods and apparatuses for forming the same. More particularly, the present invention relates to thin film solar cells and methods and apparatuses for forming the same including steps used to control contamination and improve device yield.

2. Description of the Related Art

Plasma enhanced chemical vapor deposition (PECVD) chambers for the deposition of semiconductor materials on substrates is well known in the art. Examples of such PECVD chambers are shown in U.S. Pat. No. 6,477,980 and published Patent Application US 20060060138 each of which is incorporated herein by this reference. Plasma processes include supplying a process gas mixture to a vacuum chamber called a plasma chamber and then applying electromagnetic energy to excite the process gas to a plasma state. The plasma decomposes the gas mixture into ion species that perform the desired deposition on an appropriate substrate.

The silicon solar cells formed by such deposition processes on an appropriate substrate include layers of amorphous silicon as well as micro-crystalline silicon. These layers form the p-i-n devices which absorb solar radiation and as a result, generate electrical current. In performing the desired deposition to form the p-i-n structures it is important that contamination of the i-layers does not occur during the i-layer formation process from prior deposited p-type and n-type deposited layers that may be formed in the same or subsequent processing chambers in a processing sequence. In the prior art, separate deposition chambers are commonly used to form each of the desired layers of a device. Such a process is quite slow and requires an inordinate amount of time to complete thus creating high production costs for solar cells formed by these techniques. To overcome this problem a multiple PECVD chamber apparatus has been developed which allows substrates including large substrates, to be automatically handled and transferred between the PECVD chambers to accomplish the desired deposition. Even when such deposition occurs, the throughput can be inadequate to obtain the desired production efficiencies and the achieved contamination levels can lead to a low device yield and generally poor device performance characteristics.

It is therefore desirous of having a solar cell production apparatus which includes a plurality of PECVD chambers to improve the overall throughput of the system, and improve the contamination levels in the produced cell to improve the formed device's electrical performance and the processing sequence's device yield.

SUMMARY OF THE INVENTION

The present invention generally provide a method of forming an solar cell device on a substrate, comprising depositing two or more layers on a first substrate, wherein depositing the two or more layers comprises forming an intrinsic type layer over a surface of the first substrate in a processing chamber, and forming a first doped layer on the intrinsic layer formed on the first substrate, passivating a surface of a chamber component disposed in a processing region of the processing chamber after depositing the two or more layers on the first substrate, wherein passivating the surface of the chamber component comprises depositing a passivation layer comprising silicon over the surface of the chamber component, depositing two or more layers on a second substrate, wherein depositing the two or more layers comprises forming an intrinsic type layer over a surface of the second substrate in the processing chamber, and forming a first doped layer on the intrinsic layer formed on the second substrate, and seasoning a surface of the chamber component after depositing the two or more layers on the first and second substrates, wherein seasoning the surface of the chamber component comprises removing an amount of material from the chamber component using cleaning gas, and depositing a seasoning layer comprising silicon over the surface of the chamber component.

Embodiments of the invention further provide a method of forming an solar cell device on a substrate, comprising processing a plurality of substrates in a first processing chamber, wherein processing a plurality of substrates in the first processing chamber comprises depositing a plurality of first layers on a first chamber component and on a plurality of substrates, wherein the first chamber component and one substrate from the plurality of substrates are disposed in the processing region of the first processing chamber when one of the plurality of first layers is deposited on one of the plurality of substrates, and seasoning a surface of the first chamber component disposed in the processing region of the first processing chamber after the plurality of substrates substrate have processed, wherein seasoning the surface of the first chamber component comprises removing an amount of at least a portion of the plurality of first layers deposited on the first chamber component using cleaning gas, and depositing a second layer comprising silicon on the surface of the first chamber component, processing the plurality of substrates in a second processing chamber, wherein processing the plurality of substrates in the second processing chamber comprises depositing one or more third layers on a second chamber component disposed in a processing region of the second processing chamber, and on a first layer formed on one of the plurality of substrates, and passivating a surface of the second chamber component disposed in the processing region after depositing the one or more third layers, wherein passivating the surface of the second chamber component comprises depositing a fourth layer comprising silicon over the surface of the second chamber component.

Embodiments of the invention further provide a method of forming an solar cell device, comprising removing an amount of a deposited material from a surface of a chamber component disposed in a processing region of a first processing chamber, purging the processing region of the first processing chamber with a purging gas, depositing a seasoning layer over a surface of the chamber component, wherein the seasoning layer comprises silicon, positioning a substrate on a substrate support disposed in the processing region after depositing the seasoning layer on the chamber component, and depositing one or more layers that is used to form a portion of a solar cell device on a surface of the substrate.

Embodiments of the invention further provide a method of forming an solar cell device on one or more substrates, comprising positioning at least one first processing chamber on a transfer chamber of a cluster tool, positioning at least four second processing chambers on the transfer chamber, wherein each of the at least one first processing chamber and each of the at least four second processing chambers are in transferable communication with a robot disposed in the transfer chamber, and each of the at least one first processing chambers are adapted to deposit a p-type layer on a substrate and each of the at least four second processing chambers are adapted to sequentially deposit an intrinsic type layer and an n-type layer on the substrate, forming a p-type layer over a surface of a substrate in one of the at least one first processing chambers, forming an intrinsic type layer and an n-type layer over the surface of the substrate in one of the at least four second processing chambers, and passivating a surface of a second chamber component disposed in a processing region of the one of the at least four second processing chambers after the substrate has been processed in the one of the at least four second processing chambers, wherein passivating the surface of the second chamber component comprises depositing a passivation layer comprising silicon on the surface of the second chamber component.

The present invention is directed to a method wherein there is provided a deposition system including a plurality of PECVD chambers wherein one chamber is dedicated to the deposition of a p-type amorphous silicon layer and the remainder of the chambers are each dedicated to the formation of an intrinsic silicon layer of amorphous or microcrystalline structure or alternatively such an intrinsic layer (i-step) followed by an n-type layer (n-step). Subsequent to the deposition of the intrinsic and n-type layer, there is performed a passivation process step (pass-step) to reduce contamination. As an alternative embodiment of the present invention, a remote plasma cleaning process may be performed after a plurality of successive i-step/n-step/pass-step steps have been performed.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally provide an apparatus and method for forming an improved thin film single-junction or multi-junction solar cell in a substrate processing device. One embodiment provides a system that contains at least one processing chamber that is adapted to deposit one or more layers that form a portion of a solar cell device. In one embodiment, a method is employed to reduce the contamination of a substrate processed in the processing chamber by performing a cleaning process on the inner surfaces of the processing chamber prior to depositing the one or more layers on a substrate. The cleaning process may include depositing a layer, such as a seasoning layer, that tends to trap contaminants found in the processing chamber, thus insuring that the processed substrate is clean, and future substrates processed in the chamber will have the same desirable process results. Other embodiments of the invention may provide scheduling and/or positioning the cleaning processing steps at desirable times within a substrate processing sequence to improve the overall system substrate throughput.

Figure 1:
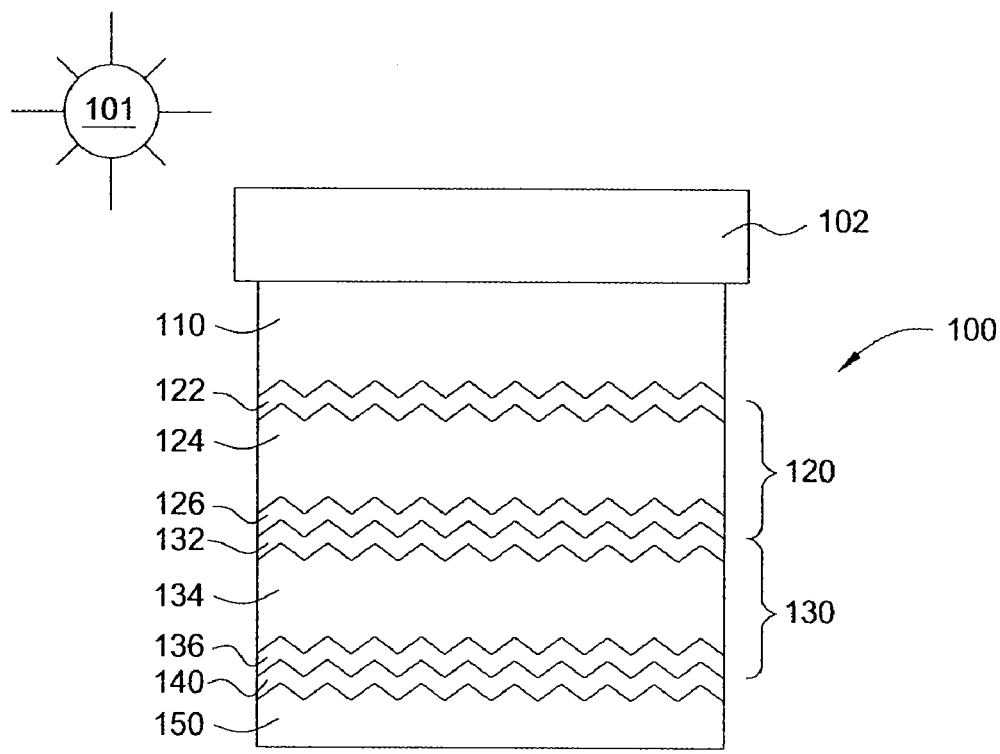
FIG. 1 is a schematic diagram of certain embodiments of a multi-junction solar cell oriented toward the light or solar radiation.

FIG. 1 is a schematic diagram of certain embodiments of a multi-junction solar cell 100 oriented toward a light source, or solar radiation 101. Solar cell 100 comprises a substrate 102, such as a glass substrate, polymer substrate, metal substrate or other suitable substrate, with thin films formed thereover. The solar cell 100 further comprises a first transparent conducting oxide (TCO) layer 110 formed over the substrate 102, a first p-i-n junction 120 formed over the first TCO layer 110, a second p-i-n junction 130 formed over the first p-i-n junction 120, a second TCO layer 140 formed over the second p-i-n junction 130, and a metal back layer 150 formed over the second TCO layer 140. To improve light absorption by reducing light reflection, the substrate and/or one or more of thin films formed thereover may be optionally textured by wet, plasma, ion, and/or mechanical processes. For example, in the embodiment shown in FIG. 1, the first TCO layer 110 is textured and the subsequent thin films deposited thereover will generally follow the topography of the surface below it.

The first TCO layer 110 and the second TCO layer 140 may each comprise tin oxide, zinc oxide, indium tin oxide, cadmium stannate, combinations thereof, or another suitable material. it is understood that the TCO materials may also include additional dopants and components. For example, zinc oxide may further include dopants, such as aluminum, gallium, boron, and other suitable dopants. Zinc oxide preferably comprises 5 atomic % or less of dopants, and more preferably comprises 2.5 atomic % or less aluminum. in certain instances, the substrate 102 may be provided by the glass manufacturers with the first TCO layer 110 already provided.

The first p-i-n junction 120 may comprise a p-type amorphous silicon layer 122, an intrinsic type amorphous silicon layer 124 formed over the p-type amorphous silicon layer 122, and an n-type micro-crystalline silicon layer 126 formed over the intrinsic type amorphous silicon layer 124. In certain embodiments, the p-type amorphous silicon layer 122 may be formed to a thickness between about 60 Å and about 200 Å. In certain embodiments, the intrinsic type amorphous silicon layer 124 may be formed to a thickness between about 2,000 Å and about 4,000 Å. In certain embodiments, the n-type micro-crystalline semiconductor layer 126 may be formed to a thickness between about 100 Å and about 600 Å.

The second p-i-n junction 130 may comprise a p-type micro-crystalline silicon layer 132, an intrinsic type micro-crystalline silicon layer 134 formed over the p-type micro-crystalline silicon layer 132, and an n-type amorphous silicon layer 136 formed over the intrinsic type micro-crystalline silicon layer 134. In certain embodiments, the p-type micro-crystalline silicon layer 132 may be formed to a thickness between about 100 Å and about 600 Å. In certain embodiments, the intrinsic type micro-crystalline silicon layer 134 may be formed to a thickness between about 10,000 Å and about 30,000 Å. In certain embodiments, the n-type amorphous silicon layer 136 may be formed to a thickness between about 100 Å and about 400 Å.

The metal back layer 150 may include, but not be limited to a material selected from the group consisting of aluminum (Al), silver (Ag), titanium (Ti), chromium (Cr), gold (Au), copper (Cu), platinum (Pt), alloys thereof, or combinations thereof. Other processes may be performed to form the solar cell 100, such as laser scribing processes. Other films, materials, substrates, and/or packaging may be provided over metal back layer 150 to complete the solar cell device. The formed solar cell devices may be interconnected to form modules, which in turn can be connected to form solar cell arrays to generate larger amounts of electrical power.

During the power generation process the solar radiation 101 is absorbed by the intrinsic layers of the p-i-n junctions 120, 130, which generate electron-holes pairs that move out of the intrinsic silicon region of the solar cell. The electric field created between the p-type layer and the n-type layer stretches across the intrinsic layer causing the electrons to flow towards the n-type layer and the holes to flow toward the p-type layer creating current. In one embodiment, the first p-i-n junction 120 comprises an intrinsic type amorphous silicon layer 124 and the second p-i-n junction 130 comprises an intrinsic type micro-crystalline silicon layer 134 because amorphous silicon and micro-crystalline silicon absorb different wavelengths of the solar radiation 101. Therefore, the solar cell 100 is more efficient since it captures a larger portion of the solar radiation striking the solar cell 100. The intrinsic type amorphous silicon layer 124 and the intrinsic type micro-crystalline silicon layer 134 are positioned in such a way that solar radiation 101 first strikes the intrinsic type amorphous silicon layer 124 and then strikes the intrinsic type micro-crystalline silicon layer 134, since amorphous silicon has a larger band gap than micro-crystalline silicon. Solar radiation not absorbed by the first p-i-n junction 120 continues on to the second p-i-n junction 130. It was surprising to find that the thicknesses disclosed herein of the p-i-n layers of the first p-i-n junction 120 and the second p-i-n junction 130 provided for a solar cell with improved efficiency and with a reduced cost of producing the same. Not wishing to be bound by theory unless explicitly recited in the claims, it is believed that thicker intrinsic layers 124, 134 are beneficial to absorb a greater amount of the solar radiation spectrum. However, if the intrinsic layers 124, 134 in either of the p-i-n junctions 120, 130 are too thick the flow of electrons through these regions can be hampered.

In one aspect, the solar cell 100 utilizes a metal tunnel layer (not shown) positioned between the first p-i-n junction 120 and the second p-i-n junction 130. The metal tunnel layer is generally not needed in case where the n-type micro-crystalline silicon layer 126 of the first p-i-n junction 120 and the p-type micro-crystalline silicon layer 132 have sufficient conductivity to provide a tunnel junction to allow electrons to easily flow from the first p-i-n junction 120 to the second p-i-n junction 130.

In one aspect, it is believed that the n-type amorphous silicon layer 136 of the second p-i-n junction 130 provides increased cell efficiency since it is more resistant to attack from air and oxygen. Air and oxygen may attack the silicon films and thus forming impurities which lower the capability of the films to participate in electron/hole transport therethrough.

Figure 2:
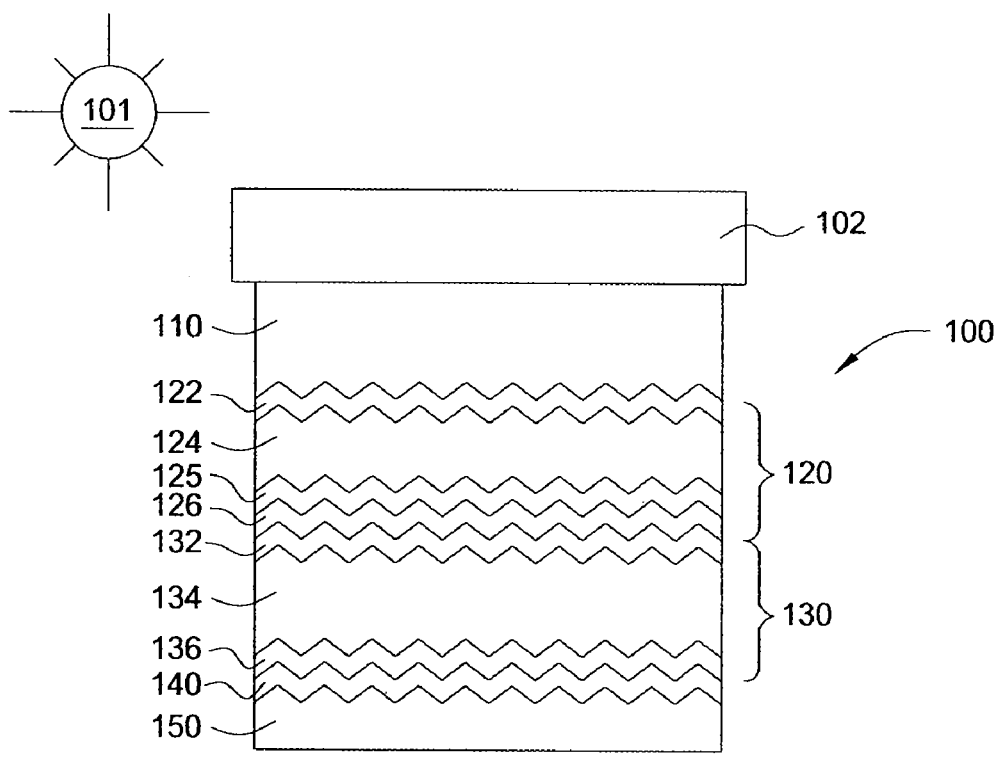
FIG. 2 is a schematic diagram of the multi-junction solar cell of FIG. 1 further comprising an n-type amorphous silicon buffer layer.

FIG. 2 is a schematic diagram of the multi-junction solar cell 100 of FIG. 1 further comprising an n-type amorphous silicon buffer layer 125 formed between the intrinsic type amorphous silicon layer 124 and the n-type micro-crystalline semiconductor layer 126. In certain embodiments, the n-type amorphous silicon buffer layer 125 may be formed to a thickness between about 10 Å and about 100 Å. It is believed that the n-type amorphous silicon buffer layer 125 helps improve the growth and/or adhesion of the n-type micro-crystalline semiconductor layer 126. It is believed that the cell efficiency can be improved by the addition of the n-type amorphous silicon buffer layer 125, since the current flow between the intrinsic type amorphous silicon layer 124 and the n-type micro-crystalline semiconductor 126 is improved by the creation of an improve interface between these layers.

Figure 3:
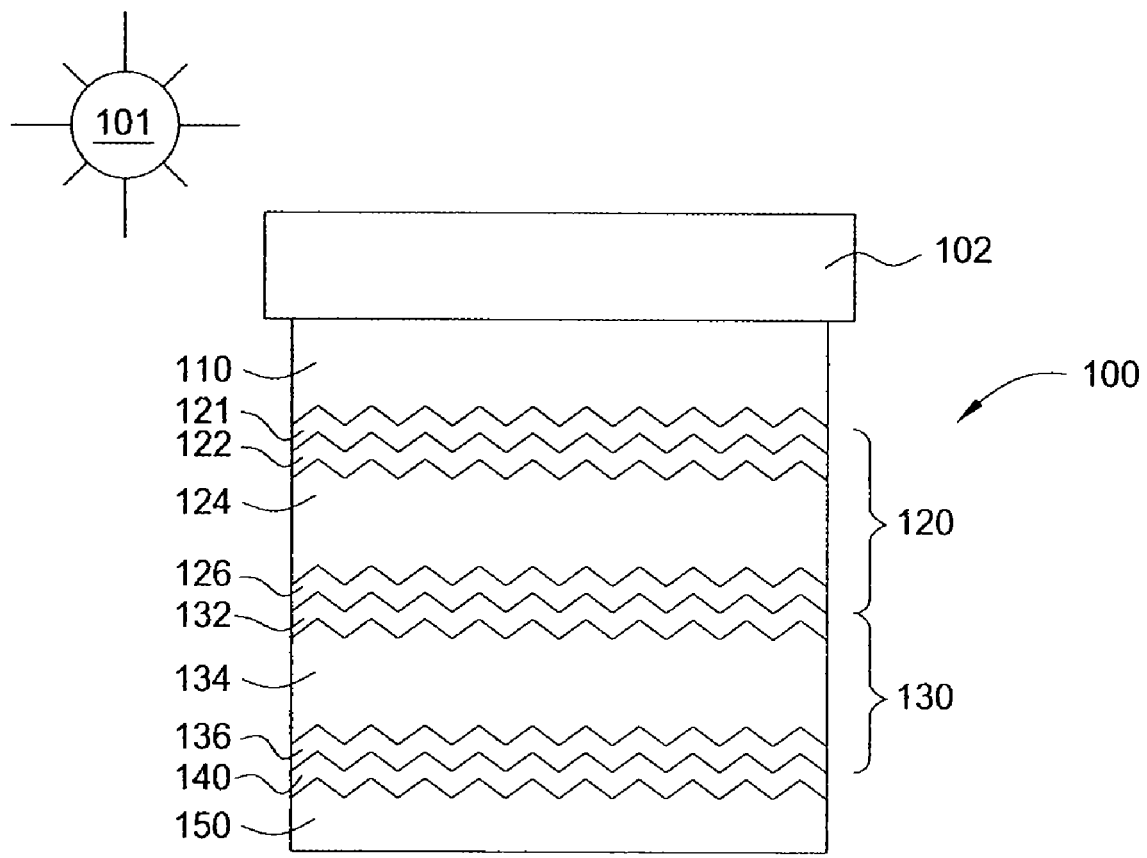
FIG. 3 is a schematic diagram of the multi-junction solar cell of FIG. 1 further comprising a p-type microcrystalline silicon contact layer.

FIG. 3 is a schematic diagram of the multi-junction solar cell 100 of FIG. 1 further comprising a p-type micro-crystalline silicon contact layer 121 formed between the first TCO layer 110 and the p-type amorphous silicon layer 122. In certain embodiments, the p-type micro-crystalline silicon contact layer 121 may be formed to a thickness between about 60 Å and about 200 Å. It is believed that the p-type micro-crystalline silicon contact layer 121 helps improve the growth and/or adhesion of the p-type amorphous silicon layer 122. Thus, it is believed that cell efficiency is improved since current flow between the intrinsic type amorphous silicon layer 124 and the first TCO layer 110 is improved due to the improved interface between these layers. In one example, the first TCO layer is a zinc oxide (ZnO) containing layer. The solar cell 100 may further comprise an optional n-type amorphous silicon buffer layer (not shown in FIG. 3) formed between the intrinsic type amorphous silicon layer 124 and the n-type micro-crystalline semiconductor layer 126 as shown and described in relation to FIG. 2 (e.g., reference numeral 125).

Figure 4:
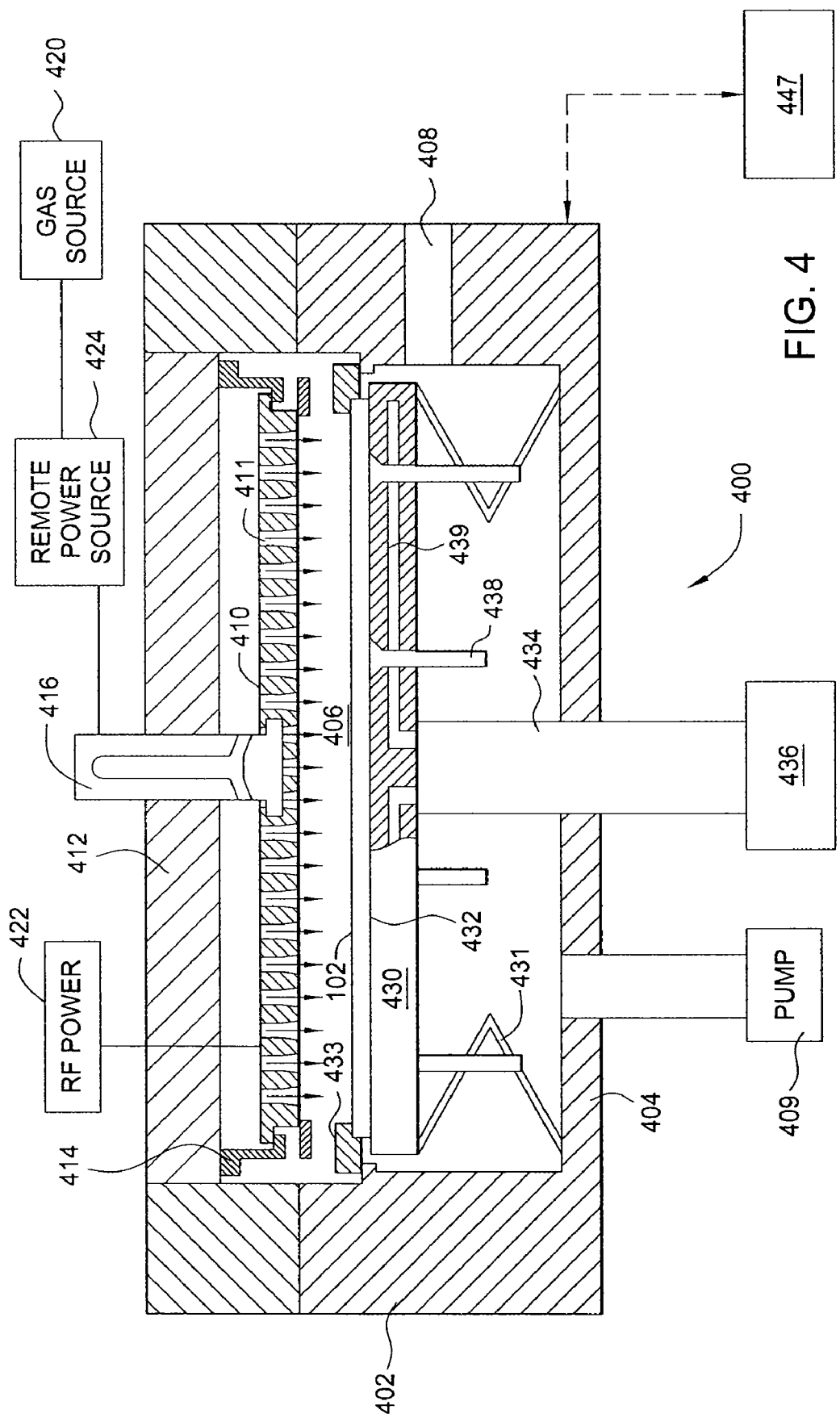
FIG. 4 is a schematic cross-section view of one embodiment of a plasma enhanced chemical vapor deposition (PECVD) chamber in which one or more films of a solar cell may be deposited.

FIG. 4 is a schematic cross-section view of one embodiment of a plasma enhanced chemical vapor deposition (PECVD) chamber 400 in which one or more films of a solar cell, such as the solar cell 100 illustrated in FIGS. 1-3, may be deposited. One suitable plasma enhanced chemical vapor deposition chamber is available from Applied Materials, Inc., located in Santa Clara, Calif. It is contemplated that other deposition chambers, including those from other manufacturers, may be utilized to practice the present invention.

The chamber 400 generally includes walls 402, a bottom 404, and a showerhead 410, and substrate support 430 which define an processing region 406. The processing region 406 is accessed through a valve 408, such that a substrate 102, may be transferred in and out of the chamber 400. The substrate support 430 includes a substrate receiving surface 432 for supporting a substrate and a stem 434 coupled to a lift system 436 to raise and lower the substrate support 430. A shadow frame 433 may be optionally placed over periphery of the substrate 102. Lift pins 438 are moveably disposed through the substrate support 430 to move a substrate to and from the substrate receiving surface 432. The substrate support 430 may also include heating and/or cooling elements 439 to maintain the substrate support 430 at a desired temperature. The substrate support 430 may also include grounding straps 431 to provide RF grounding at the periphery of the substrate support 430. Examples of grounding straps are disclosed in U.S. Pat. No. 6,024,044 issued on Feb. 15, 2000 to Law et al. and U.S. patent application Ser. No. 11/613,934 filed on Dec. 20, 2006 to Park et al., which are both incorporated by reference in their entirety to the extent not inconsistent with the present disclosure.

The showerhead 410 is coupled to a backing plate 412 at its periphery by a suspension 414. The showerhead 410 may also be coupled to the backing plate by one or more center supports 416 to help prevent sag and/or control the straightness/curvature of the showerhead 410. A gas source 420 is coupled to the backing plate 412 to provide gas through the backing plate 412 and through the ports 411 formed in the showerhead 410 to the substrate receiving surface 432. A vacuum pump 409 is coupled to the chamber 400 to control the processing region 406 at a desired pressure. An RF power source 422 is coupled to the backing plate 412 and/or to the showerhead 410 to provide a RF power to the showerhead 410 so that an electric field is created between the showerhead 410 and the walls 402 and/or substrate support 430 to form a plasma using the gases disposed in the processing region 406. Various RF frequencies may be used, such as a frequency between about 0.3 MHz and about 200 MHz. In one embodiment the RF power source is provided at a frequency of 13.56 MHz. Examples of showerheads are disclosed in U.S. Pat. No. 6,477,980 issued on Nov. 12, 2002 to White et al., U.S. Publication 20050251990 published on Nov. 17, 2006 to Choi et al., and U.S. Publication 20060060138 published on Mar. 23, 2006 to Keller et al., which are all incorporated by reference in their entirety to the extent not inconsistent with the present disclosure.

A remote plasma source 424, such as an inductively coupled remote plasma source, may also be coupled between the gas source 420 and the backing plate 412. Therefore, a reactive cleaning gas can provided to clean the various chamber 400 components by delivering a cleaning gas to the remote plasma source 424 so that a plasma activated cleaning gas can be generated and then delivered to the surface of the processing chamber components. The cleaning gas may be further excited by delivering energy to the showerhead 410 from the RF power source 422. Suitable cleaning gases include but are not limited to $NF_3$, $F_2$, $CF_4$, $SF_6$, $C_2F_6$, $CCl_4$, and $C_2Cl_6$. Examples of remote plasma sources are further disclosed in U.S. Pat. No. 5,788,778 issued Aug. 4, 1998 to Shang et al., which is incorporated by reference to the extent not inconsistent with the present disclosure.

The following deposition parameters and deposition methods can be used to form one or more silicon layers of a solar cell device, such as one or more of the silicon layers of solar cell 100 illustrated in FIGS. 1-3, using a process chamber similar to the processing chamber 400 illustrated in FIG. 4. In one example, a substrate 102 having a surface area of 10,000 $cm^2$ or more, preferably 40,000 $cm^2$ or more, and more preferably 55,000 $cm^2$ or more is provided to the processing chamber. It should be noted that after processing the substrate 102 may be cut to form smaller solar cell devices.

In one embodiment, the heating and/or cooling elements 439 may be set to provide a substrate support temperature during deposition of about 400 degrees Celsius (° C.) or less, preferably between about 100° C. and about 400° C., more preferably between about 150° C. and about 400° C., such as about 200° C.

The spacing during deposition between the top surface of a substrate disposed on the substrate receiving surface 432 and the showerhead 410 may be between 400 mil (0.010 m) and about 1,200 mil (0.030 m), preferably between 400 mil and about 800 mil. Typical thicknesses of glass substrates for solar applications are between about 40 mil (0.0010 m) and about 200 mil (0.0051 m).

In one embodiment, a controller 447 is generally designed to facilitate the control and automation of the chamber 400 and system 500 (FIG. 5) and typically may include a central processing unit (CPU) (not shown), memory (not shown), and support circuits (or I/O) (not shown). The CPU may be one of any form of computer processors that are used in industrial settings for controlling various chamber processes and hardware (e.g., detectors, motors, fluid delivery hardware, etc.) and monitor the system and chamber processes (e.g., substrate position, process time, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the controller 447 determines which tasks are performable on a substrate. Preferably, the program is software readable by the controller 447, which includes code to generate and store at least process recipe sequencing, substrate positional information, the sequence of movement of the various controlled components, process control, process timing, scheduling, queuing steps, and any combination thereof.

For deposition of silicon films, a silicon-based gas and a hydrogen-based gas are generally provided. Suitable silicon-based gases include, but are not limited to silane ($SiH_4$), disilane ($Si_2H_4$), silicon tetrafluoride ($SiF_4$), silicon tetrachloride ($SiCl_4$), dichlorosilane ($SiH_2Cl_2$), and combinations thereof. Suitable hydrogen-based gases include, but are not limited to, hydrogen gas ($H_2$). The p-type dopants of the p-type silicon layers may each comprise a group III element, such as boron or aluminum. Preferably, boron is used as the p-type dopant. Examples of boron-containing sources include trimethylboron (TMB or $B(CH_3)_3$), triethylboron (TEB), diborane ($B_2H_6$) and similar compounds. The n-type dopants of the n-type silicon layer may each comprise a group V element, such as phosphorus (P), arsenic (As), or antimony (Sb). Preferably, phosphorus is used as the n-type dopant.

Examples of phosphorus-containing sources include phosphine ($PH_3$) and similar compounds. The dopants are typically provided with a carrier gas, such as hydrogen, argon, and other suitable compounds.

Certain embodiments of depositing a p-type micro-crystalline silicon contact layer, such as contact layer 121 of FIG. 3, may comprise providing a gas mixture of hydrogen gas ($H_2$) to silane ($SiH_4$) gas in ratio of about 200:1 or greater. Silane gas may be provided at a flow rate between about 0.05 sccm/L and about 0.5 sccm/L. Hydrogen gas may be provided at a flow rate between about 50 sccm/L and about 400 sccm/L. Trimethylboron (0.5% volume concentration in $H_2$) may be provided at a flow rate between about 0.05 sccm/L and about 0.5 sccm/L. The flow rates in the present disclosure are expressed as standard cubic centimeters per minute (sccm) per interior chamber volume. The interior chamber volume is defined as the volume of the interior of the chamber in which a gas can occupy during processing. For example, the interior chamber volume of chamber 400 is the volume generally defined by the backing plate 412 and by the walls 402 and bottom 404 of the chamber minus the volume occupied therein by the showerhead assembly (i.e., including the showerhead 410, suspension 414, center support 416) and by the substrate support assembly (i.e., substrate support 430, grounding straps 431). An RF power between about 50 milliWatts/$cm^2$ and about 700 milliWatts/$cm^2$ may be provided to the showerhead. In some configurations, it is desirable to size the showerhead 410 so that it is about 20% larger than the dimensions of the substrate 102. The RF powers in the present disclosure are expressed as Watts supplied to an electrode per substrate area. For example, in a case where an RF power of 10,385 Watts supplied to a showerhead having dimensions of 220 cm×260 cm, the equivalent RF power would equal 10,385 Watts/(220 cm×260 cm)=180 milliwatts/$cm^2$. The pressure of the chamber may be maintained between about 1 Torr and about 100 Torr, preferably between about 3 Torr and about 20 Torr, more preferably between 4 Torr and about 12 Torr. The deposition rate of the p-type micro-crystalline silicon contact layer may be about 30 Å/min or more.

Certain embodiments of depositing a p-type amorphous silicon layer, such as the silicon layer 122 illustrated in FIGS. 1-3, may comprise providing a gas mixture of hydrogen gas to silane gas in a ratio of about 20:1 or less. Silane gas may be provided at a flow rate between about 1 sccm/L and about 10 sccm/L. Hydrogen gas may be provided at a flow rate between about 5 sccm/L and about 50 sccm/L. Trimethylboron (0.5% volume concentration mixture in $H_2$) may be provided at a flow rate between about 1 sccm/L and about 10 sccm/L. Methane may be provided at a flow rate between about 1 sccm/L and about 15 sccm/L. An RF power between about 25 milliWatts/$cm^2$ and about 200 milliWatts/$cm^2$ may be provided to the showerhead. The pressure of the chamber is maintained between about 0.1 Torr and about 20 Torr, preferably between about 1 Torr and about 4 Torr. The deposition rate of the p-type amorphous silicon layer may be about 100 Å/min or more.

Certain embodiments of depositing an intrinsic type amorphous silicon layer, such as the silicon layer 124 illustrated in FIGS. 1-3, comprises providing a gas mixture of hydrogen gas to silane gas in a ratio of about 20:1 or less. Silane gas may be provided at a flow rate between about 0.5 sccm/L and about 7 sccm/L, Hydrogen gas may be provided at a flow rate between about 5 sccm/L and about 60 sccm/L. An RF power of between about 15 milliWatts/$cm^2$ and about 250 milliWatts/$cm^2$ may be provided to the showerhead. The pressure of the chamber may be maintained between about 0.1 Torr and about 20 Torr, preferably between about 0.5 Torr and about 5 Torr. The deposition rate of the intrinsic type amorphous silicon layer may be about 100 Å/min or more.

Certain embodiments of depositing an n-type amorphous silicon buffer layer, such as the silicon layer 125 of FIG. 2, comprise providing hydrogen gas to silicon gas in a ratio of about 20:1 or less. Silane gas may be provided at a flow rate between about 1 sccm/L and about 10 sccm/L. Hydrogen gas may be provided at a flow rate between about 4 sccm/L and about 40 sccm/L, phosphine (0.5% volume concentration mixture in $H_2$) may be provided at a flow rate between about 0.1 sccm/L and about 1.5 sccm/L. An RF power between about 15 milliWatts/$cm^2$ and about 250 milliWatts/$cm^2$ may be provided to the showerhead. The pressure of the chamber may be maintained between about 0.1 Torr and 20 Torr, preferably between about 0.5 Torr and about 4 Torr. The deposition rate of the intrinsic type amorphous silicon layer may be about 200 Å/min or more.

Certain embodiments of depositing a n-type micro-crystalline silicon layer, such as the silicon layer 126 illustrated in FIGS. 1-3, may comprise providing a gas mixture of hydrogen gas to silane gas in a ratio of about 100:1 or more. Silane gas may be provided at a flow rate between about 0.05 sccm/L and about 0.5 sccm/L. Hydrogen gas may be provided at a flow rate between about 30 sccm/L and about 250 sccm/L. Phosphine (0.5% volume concentration mixture in $H_2$) may be provided at a flow rate between about 0.1 sccm/L and about 0.8 sccm/L. An RF power of between about 100 milliWatts/$cm^2$ and about 900 milliWatts/$cm^2$ may be provided to the showerhead. The pressure of the chamber may be maintained between about 1 Torr and 100 Torr, preferably between about 3 Torr and about 20 Torr, more preferably between 4 Torr and about 12 Torr. The deposition rate of the n-type micro-crystalline silicon layer may be about 50 Å/min or more.

Certain embodiments of depositing a p-type microcrystalline silicon layer, such as silicon layer 132 illustrated in FIGS. 1-3, comprises providing a gas mixture of hydrogen gas to silane gas in a ratio of about 200:1 or greater. Silane gas may be provided at a flow rate between about 0.05 sccm/L and about 0.5 sccm/L. Hydrogen gas may be provided at a flow rate between about 50 sccm/L and about 400 sccm/L. Trimethylboron (0.5% volume concentration in $H_2$) may be provided at a flow rate between 0.05 and about 0.5 sccm/L. An RF power between about 50 milliWatts/$cm^2$ and about 700 milliWatts/$cm^2$ may be provided to the showerhead. The pressure of the chamber may be maintained between about 1 Torr and about 100 Torr, preferably between about 3 Torr and about 20 Torr, more preferably between 4 Torr and about 12 Torr. The deposition rate of the p-type microcrystalline silicon layer may be about 30 Å/min or more.

Certain embodiments of depositing an intrinsic type microcrystalline silicon layer, such as silicon layer 134 illustrated in FIGS. 1-3, may comprise providing a gas mixture of silane gas to hydrogen gas in a ratio between 1:20 and 1:200. Silane gas may be provided at a flow rate between about 0.3 sccm/L and about 3 sccm/L. Hydrogen gas may be provided at a flow rate between about 20 sccm/L and about 200 sccm/L. In certain embodiments, the silane flow rate may be ramped down from a first flow rate to a second flow rate during deposition. In certain embodiments the hydrogen flow rate may be ramped down from a first flow rate to a second flow rate during deposition. An RF power of about 300 milliWatts/$cm^2$ or greater, preferably 450 milliWatts/$cm^2$ or greater, may be provided to the showerhead. In certain embodiments, the power density may be ramped down from a first power density to a second power density during deposition. The pressure of the chamber is maintained between about 1 Torr and 100 Torr, preferably between about 3 Torr and about 20 Torr, more preferably between about 4 Torr and about 12 Torr. The deposition rate of the intrinsic type silicon layer may be about 200 Å/min or more, preferably 400 Å/min. Methods and apparatus for deposited micro-crystalline intrinsic layer are disclosed in U.S. patent application Ser. No. 11/426,127 filed Jun. 23, 2006, entitled "Methods and Apparatus for Depositing a Microcrystalline Silicon Film for Photovoltaic Device," which is incorporated by reference in its entirety to the extent not inconsistent with the present disclosure. In certain embodiment, the micro-crystalline silicon intrinsic layer has a crystalline fraction between about 20 percent and about 80 percent, preferably between 55 percent and about 75 percent. It was surprising to find that a micro-crystalline silicon intrinsic layer having a crystalline fraction of about 70%, or below, provided an increase in open circuit voltage and leads to higher cell efficiency.

Certain embodiments of a method depositing a n-type amorphous silicon layer, such as the silicon layer 136 illustrated in FIGS. 1-3, may comprise depositing an optional first n-type amorphous silicon layer at a first silane flow rate and depositing a second n-type amorphous silicon layer over the first n-type amorphous silicon layer at a second silane flow rate lower than the first silane flow rate. The first n-type amorphous silicon layer may comprise providing a gas mixture of hydrogen gas to silane gas in a ratio of about 20:1 or less. Silane gas may be provided at a flow rate between about 1 sccm/L and about 10 sccm/L. Hydrogen gas may be provided at a flow rate between about 4 sccm/L and about 40 sccm/L. Phosphine (0.5% volume concentration in $H_2$) may be provided at a flow rate between about 0.5 sccm/L and about 3.5 sccm/L. An RF power of between 25 milliWatts/cm$^2$ and about 250 milliWatts/cm$^2$ may be provided to the showerhead. The pressure of the chamber may be maintained between about 0.1 Torr and about 20 Torr, preferably between about 0.5 Torr and about 4 Torr. The deposition rate of the first n-type type amorphous silicon layer may be about 200 Å/min or more. The second n-type amorphous silicon layer may comprise providing a gas mixture of hydrogen gas to silane gas in a ratio of about 1:20 or less. Silane gas may be provided at a flow rate between about 0.2 sccm/L and about 2 sccm/L. Hydrogen gas may be provided at a flow rate between about 1 sccm/L and about 10 sccm/L. Phosphine (0.5% volume concentration in $H_2$) may be provided at a flow rate between about 0.5 sccm/L and about 10 sccm/L. An RF power of between 25 milliWatts/cm$^2$ and about 250 milliWatts/cm$^2$ may be provided to the showerhead. The pressure of the chamber may be maintained between about 0.1 Torr and about 20 Torr, preferably between about 0.5 Torr and about 4 Torr. The deposition rate of the second n-type type amorphous silicon layer may be about 200 Å/min or more.

Figure 5:
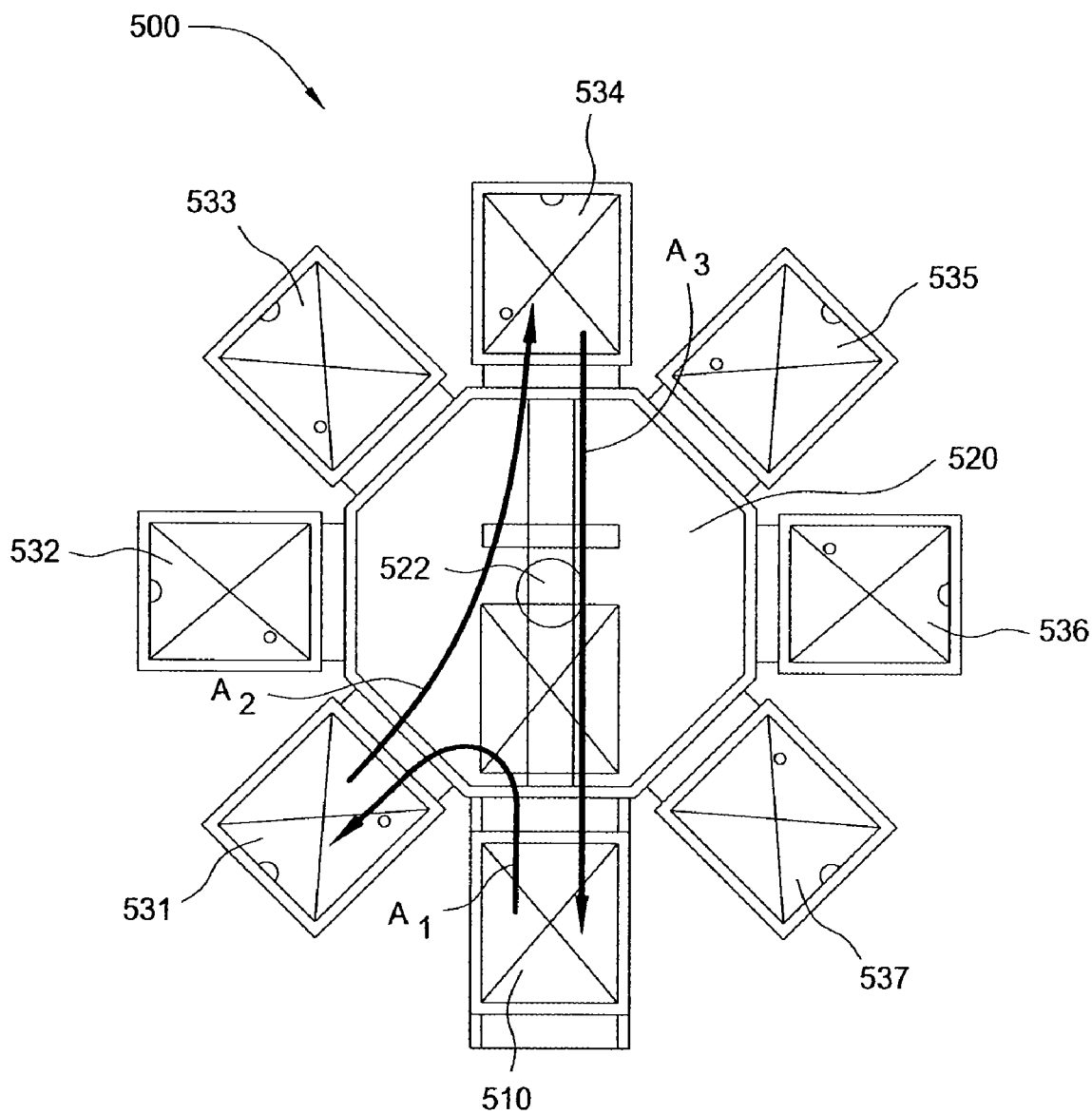
FIG. 5 is a top schematic view of one embodiment of a process system having a plurality of process chambers.

FIG. 5 is a schematic plan view of one embodiment of a processing system 500 having a plurality of process chambers 531-537, such as the PECVD chamber 400 of FIG. 4 or other suitable chambers capable of depositing silicon films. The processing system 500 includes a transfer chamber 520 coupled to a load lock chamber 510 and the process chambers 531-537. The load lock chamber 510 allows substrates to be transferred between the ambient environment outside the system and vacuum environment within the transfer chamber 520 and process chambers 531-537. The load lock chamber 510 includes one or more evacuatable regions holding one or more substrates. The evacuatable regions are pumped down during input of substrates into the processing system 500 and are vented during output of the substrates from the processing system 500. In one embodiment, the transfer chamber 520 has at least one vacuum robot 522 disposed therein that is adapted to transfer substrates between the load lock chamber 510 and the process chambers 531-537, while the transfer chamber 520 is maintained at a vacuum condition. In another embodiment, the transfer chamber 520 is maintained near atmospheric pressure and contains an amount of an inert gas.

In one embodiment of the processing system 500, one of the process chambers 531-537 is configured to deposit a p-type silicon layer(s) of the first or second p-i-n junctions, another one of the process chambers 531-537 is configured to deposit an intrinsic silicon layer of the first or second p-i-n junctions, and another of the process chambers 531-537 is configured to deposit the n-type silicon layer(s) of the first or second p-i-n junctions. While a three chamber process configuration may have some contamination control advantages, it will generally have a lower substrate throughput than a two chamber processing system (further discussed below), the robot utilization will be much higher due to the increased number of transferring steps which can make the process sequence robot limited, and the process chamber utilization efficiency drops dramatically when one of the chambers is taken out of production to resolve some process or hardware issue.

In certain embodiments of the invention, one processing system 500 is configured to deposit the first p-i-n junction comprising an intrinsic type amorphous silicon layer(s) of a multi-junction solar cell, such as the first p-i-n junction 120 illustrated in FIGS. 1-3. In one embodiment, one of the process chambers 531-537 is configured to deposit the p-type silicon layer(s) of the first p-i-n junction while the remaining process chambers 531-537 are each configured to deposit both the intrinsic type amorphous silicon layer(s) and the n-type silicon layer(s) of the first p-i-n junction. In one embodiment, the intrinsic type amorphous silicon layer(s) and the n-type silicon layer(s) of the first p-i-n junction 120 may be deposited in the same chamber without performing a passivation process (discussed below) in between the deposition steps. While the discussion of the processing system 500 and its components references its use in forming the various elements of the first p-i-n junction this configuration is not intended to be limiting as to the scope of the invention described herein, since the processing system 500 could be adapted to form the first p-i-n junction, the second p-i-n junction, both the first and second p-i-n junctions, or other combinations thereof without deviating from the basic scope of the invention described herein.

In one example of a substrate processing sequence performed in the processing system 500, a substrate enters the processing system 500 through the load lock chamber 510, is transferred by the vacuum robot into the dedicated process chamber configured to deposit the p-type silicon layer(s), is transferred by the vacuum robot into one of the remaining process chambers configured to deposit both the intrinsic type silicon layer(s) and the n-type silicon layer(s), and is transferred by the vacuum robot back to the load lock chamber 510. In one example, as shown in FIG. 5, a substrate is transferred by the vacuum robot 522 into the process chamber 531 (see path $A_1$), which is configured to deposit one or more p-type silicon layer(s) on the substrate, the substrate is then transferred by the vacuum robot 522 into the process chamber 534 (see path $A_2$), which configured to deposit both the intrinsic type silicon layer(s) and the n-type silicon layer(s), and then the substrate is returned to the load lock chamber 510 (see path $A_3$) after which the substrate can be removed from the system.

Assuming that the p-type layer is 150 Å in thickness and the deposition rate of 500 Å per minute, the period of time to deposit the p-type layer is approximately 0.3 minute. For an intrinsic layer of 2,700 Å at a deposition rate of 220 Å/min., the time period to deposit the intrinsic layer is approximately 12.3 minutes. Assuming an n-type layer of 250 Å at a deposition rate of 500 Å per minute it will require approximately 0.5 minute to deposit the n-type layer. It can therefore be seen that if one chamber is dedicated to deposition of a p-type layer and multiple chambers are dedicated to deposition of the i-n layer, an increased throughput of substrates can be realized by increasing the number processing chambers that can produce the i-n layers in parallel. That is, a continuous series of substrates can be loaded and maneuvered by the transfer chamber 520 from a process chamber that is adapted to deposit a p-type layer, such as process chamber 531, and then transfer each of the substrates to at least one subsequent processing chamber, such as process chambers 532 through 537 to form the i-n layers.

In one embodiment, the processing sequence and processing times in each of the processing chambers can be adjusted to improve the substrate throughput and process results. In one example, in which the first processing chamber is adapted to deposit a p-type layer and a second processing chamber is adapted to deposit an intrinsic layer and an n-type layer it may be desirable to adjust the processing time, such as add to the time the substrate is positioned on the substrate support in the first processing chamber to allow the substrate to be heated, or cooled, to a desired temperature before it is transferred to the second processing chamber. In this case, since the deposition time in the first processing chamber is generally less than the processing time in the second processing chamber the added time to equilibrate the substrate temperature can be adjusted so that the substrate throughput is not affected by the additional time spent in the first processing chamber. In one embodiment, the system controller 447 is adapted to control and adjust the processing times, substrate queue times, and other process parameters to improve the process results and system throughput.

Figure 6:
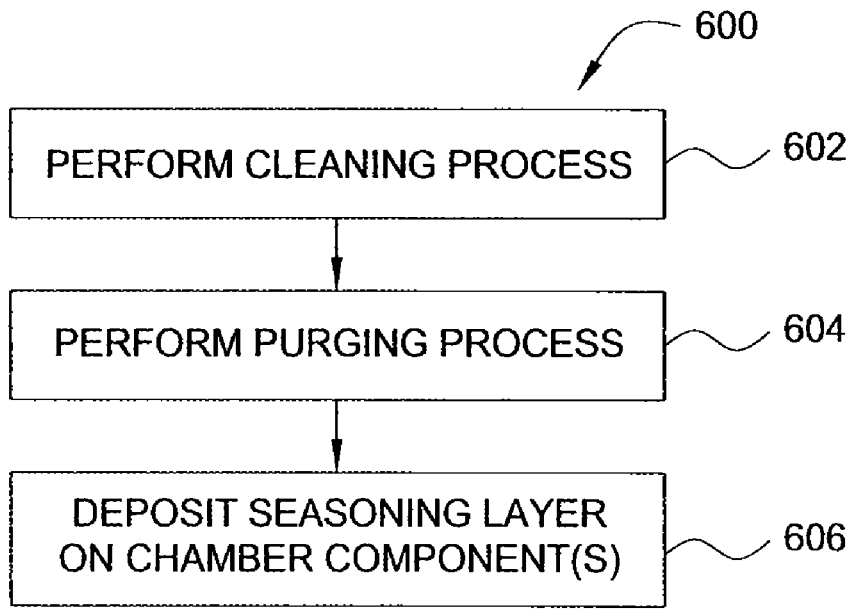
FIG. 6 illustrates a flow chart of a method of cleaning and seasoning the surfaces of a processing chamber in accordance with one embodiment of the present invention.

In a two chamber processing configuration, subsequent to deposition of the i-n layers in each of the chambers dedicated to producing the same, the process may be repeated. However, to preclude contamination being incorporated into the intrinsic layers formed on subsequent substrates, it has been found that performing a cleaning process, such as a seasoning process 600 in each of the chambers dedicated to producing the i-n layers at some desired interval the device yield of the processing sequence can be improved. The seasoning process 600 may generally comprises one or more steps that are used to remove prior deposited material from a processing chamber part and one or more steps that are used to deposit a material on the processing chamber part as discussed in accordance with one of the embodiments described herein. FIG. 6 illustrates one embodiment of a seasoning process 600 that is used to reduce the contamination in subsequently formed layers on subsequently processed substrates 102.

In the first step, or cleaning process 602, at least one cleaning step is performed in the chamber to remove at least a portion of the previously deposited material found on the surfaces of the components (e.g., walls 402, shadow frame 433, showerhead 410) in the processing chamber. One such cleaning process utilizes a high powered remote excitation source, such as that disclosed in U.S. Pat. No. 5,788,778, which is referred to above and incorporated by reference herein, which uses a cleaning gas, such as $NF_3$, $F_2$, $CF_4$, $SF_6$, $C_2F_6$, $CCl_4$, $C_2Cl_6$, a halogen and/or a halogen containing compound, or the like. Alternatively as opposed to using a remote plasma source, the cleaning process 602 is accomplished by generating a plasma in the processing region 406 of the processing chamber 400 using a suitable cleaning gas. In general, the cleaning process 602 is performed to remove the prior deposited layer(s) and any contaminants that could affect the adhesion of subsequently deposited material on the chamber components (e.g., walls 402, bottom 404, showerhead 410, substrate support 430) to reduce particulate contamination sources, and/or reduce the chances of contamination of a subsequently deposited intrinsic layer(s) due to dopants contained in the prior deposited layer.

In the next step, or purging step 604, a gas is delivered to the processing region of the processing chamber to remove any undesirable residual contaminants that are disposed in the processing region or on the surface of the chamber components. In one embodiment, the purging step 604 is performed by flowing a purge gas that contains a reactive gas(es), such as hydrogen ($H_2$) gas, into the PECVD process chamber. In one example, the purge gas comprises an inert gas, such as argon. In one configuration it is also desirable to generate a plasma during the purging step 604 to increase the activity of the reactive gas(es) and energy of the inert gases during processing. The formation of hydrogen containing plasma during the purging step 604 can be effective in removing any undesirable contaminants that are bonded to, or adsorbed on, the chamber surfaces during the previous cleaning process 602 step(s). In one example, a hydrogen plasma is used to remove the undesirable fluorine (F) containing contaminants that are bonded to, or adsorbed on, the chamber surfaces by forming a volatile HF containing vapor that is removed by the vacuum pumping system (e.g., vacuum pump 409 in FIG. 4).

In the next step, or seasoning process 606, a seasoning layer is disposed on to the surface(s) of the processing chamber components. In one embodiment, the seasoning layer is an amorphous silicon layer, which is deposited by flowing an appropriate gas such as silane through the deposition chamber and generating a plasma to deposit the layer of amorphous silicon on the surfaces of the processing chamber components. The seasoning layer thus acts as a shield over any residual deposited material that is disposed on the various process chamber components. The seasoning layer is generally effective in reducing and/or preventing the contamination of a deposited intrinsic layer due to a left over deposited n-type and/or p-type layers disposed on the chamber components. In one example, the seasoning layer is deposited by providing a gas mixture of hydrogen gas to silane gas in a ratio of about 1:20 or less at a chamber pressure between about 0.1 Torr and about 20 Torr. Silane gas may be provided at a flow rate between about 0.5 sccm/L and about 7 sccm/L, and the hydrogen gas may be provided at a flow rate between about 5 sccm/L and about 60 sccm/L. An RF power of between 15 milliWatts/cm$^2$ and about 250 milliWatts/cm$^2$ may be provided to the showerhead. In one example, the seasoning layer thickness is greater than about 200 Å. In another example, the seasoning layer thickness is greater than about 500 Å. In yet another example, the seasoning layer thickness is between about 500 Å and about 1500 Å.

In general, the seasoning process 600 is performed without a substrate being disposed in the processing region of the processing chamber. However, in some cases during one or more of the seasoning process 600 steps a dummy substrate, or a non-usable substrate, is positioned on the substrate support to reduce future substrate contamination and device yield problems. In one example, a dummy substrate is disposed on the substrate supporting surface to prevent deposition of the seasoning layer on the substrate supporting surface.

Figure 7A:
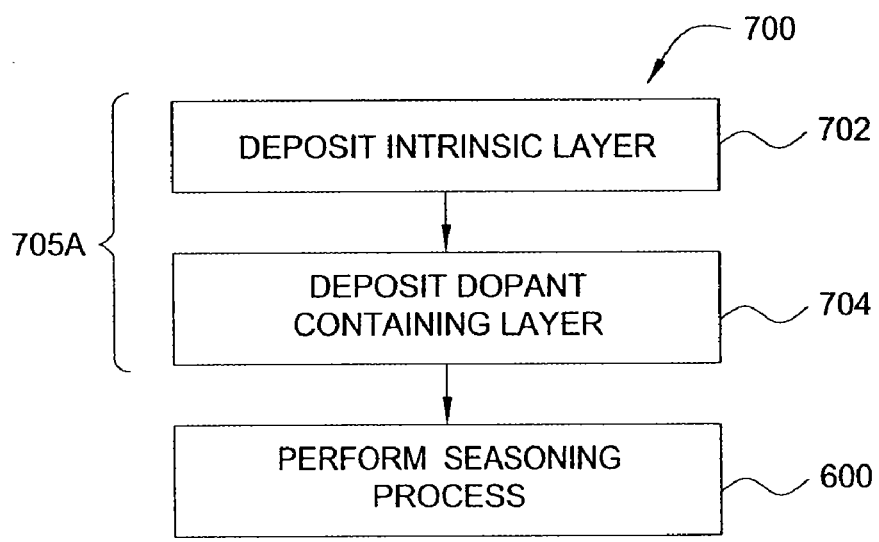
FIG. 7A illustrates a flow chart of a processing sequence performed in a processing chamber in accordance with one embodiment of the present invention.

Therefore, to improve device yield of a substrate processing sequence that is used to form one or more layers within the first p-i-n junction 120 and/or second p-i-n junction 130 the seasoning process 600 is performed at regular intervals between the deposition steps performed in each of the processing chambers in a cluster tool (e.g., processing system 500 in FIG. 5). FIG. 7A illustrates one embodiment of a processing sequence 700 performed in a processing chamber in which a substrate deposition process 705A is performed on a substrate and then the seasoning process 600 is performed on the processing chamber components. In one example, as shown in FIG. 7A, the substrate deposition process 705 includes a two step deposition process, in which an intrinsic layer is deposited on the surface of a substrate (i.e., step 702) and then a dopant containing layer is deposited on over the intrinsic layer (i.e., step 704). In one case, the dopant containing layer is an n-type layer or a p-type layer as discussed above.

Figure 7B:
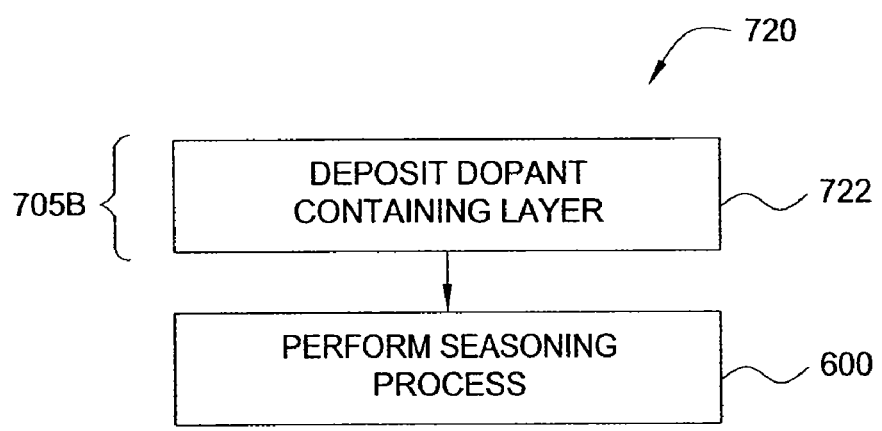
FIG. 7B illustrates a flow chart of a processing sequence performed in a processing chamber in accordance with one embodiment of the present invention.

FIG. 7B illustrates one embodiment of a processing sequence 720 performed in a processing chamber, in which a single layer is deposited on a substrate during the substrate deposition process 705B prior to performing a seasoning process 600 on the processing chamber components. In one example, the substrate deposition process 705B includes a single deposition process step, in which a doped layer is deposited on the surface of a substrate (i.e., step 722). In one case, the dopant containing layer is an n-type layer or a p-type layer as discussed above. While FIGS. 7A-7B illustrate a two step deposition process and a single step deposition process, respectively, this configurations are not intended to be limiting as to the scope of the invention since other multiple step deposition processes may be performed without deviating from the basic scope of the invention described herein.

Figure 8:
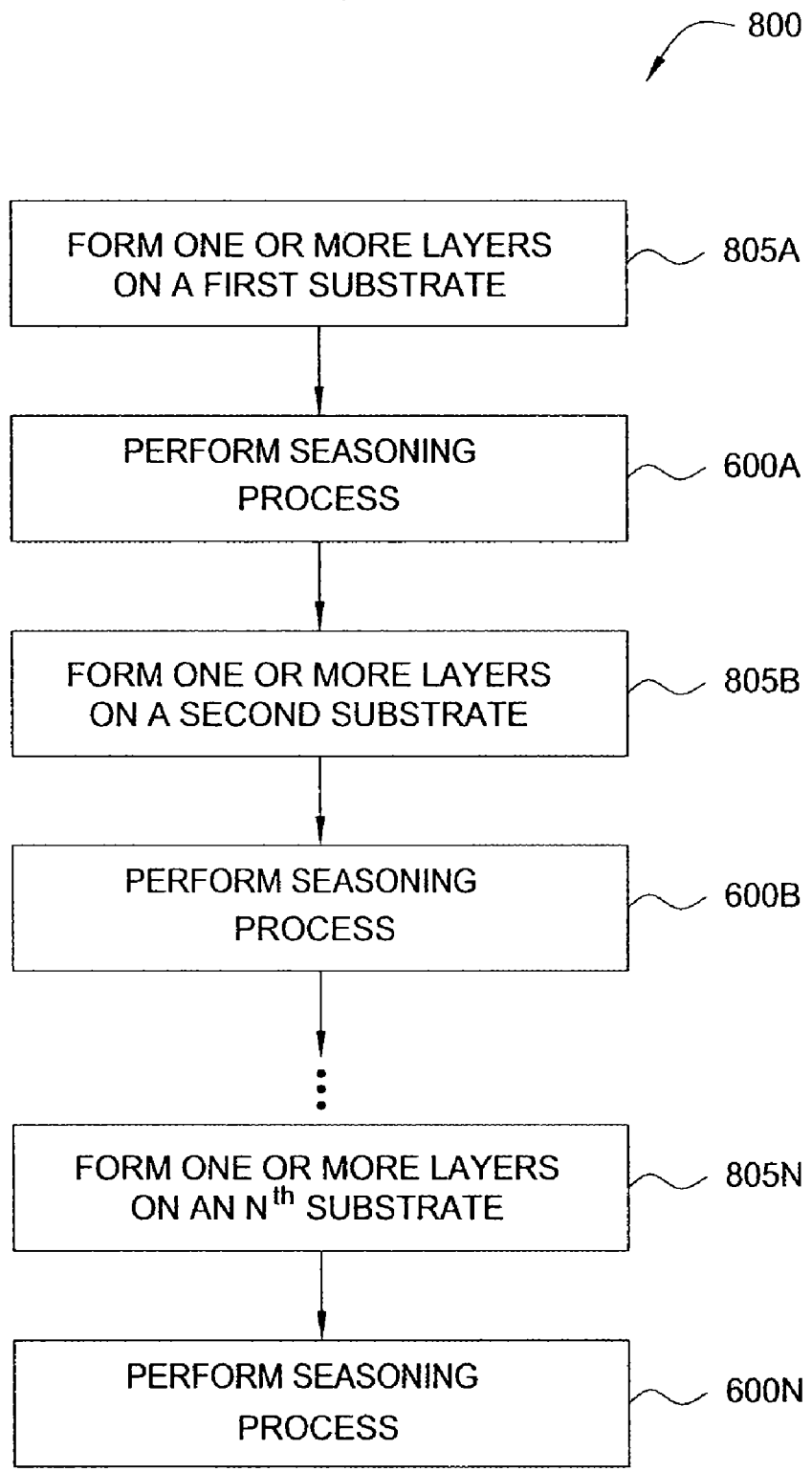
FIG. 8 illustrates a flow chart of a processing sequence performed in a processing chamber in accordance with one embodiment of the present invention.

FIG. 8 illustrates one embodiment of a processing sequence 800 performed in a processing chamber in which a series of deposition process steps (e.g., reference numerals 805A-805N) are performed on multiple substrates with a series of seasoning processes (e.g., reference numerals 600A-600N) being performed after each of the deposition process step. As shown in FIG. 8, the processing sequence 800 includes forming one or more layers on a substrate and then performing a seasoning process on the process chamber components sequentially N number of times, where N is a desired number of substrates. In one example, the each of the deposition process step 805A-805N, includes forming an intrinsic type layer and then forming a dopant containing layer, such as an n-type or p-type layer, on a substrate. In general, the seasoning process 600A-600N steps are similar to the seasoning process 600 discussed above. Also, the deposition process steps 805A-805N discussed herein are generally similar to at least one of the deposition processes 705A-705B and/or the process examples, which are described above.

Figure 9:
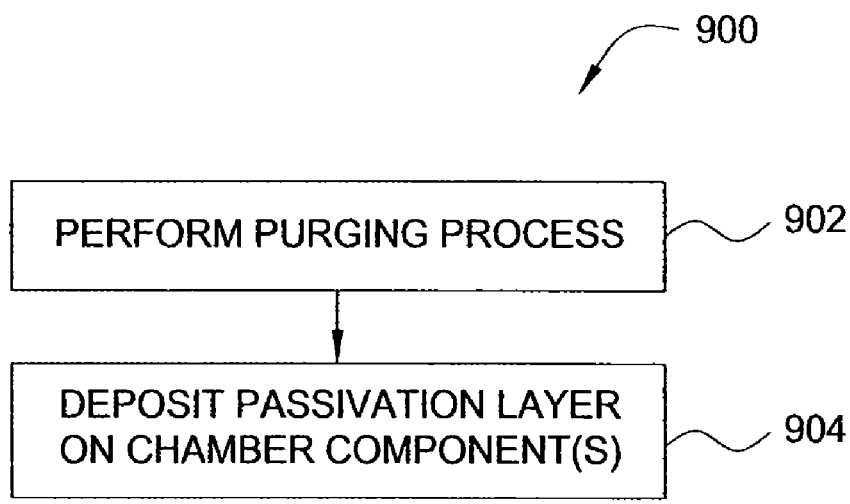
FIG. 9 illustrates a flow chart of a method of passivating the surfaces of a processing chamber in accordance with one embodiment of the present invention.

In an effort to increase the substrate throughput within a processing system 500 a less complex cleaning process, such as a passivation process 900 (FIG. 9), may be used in place of the seasoning process 600 during various parts of a processing sequence. It has been found that performing a passivation process 900 after depositing an i-n layers on each substrate 102, or at some other desired interval, the substrate throughput can be increased, while desirable contamination levels can be maintained in the processing chamber. FIG. 9 illustrates one embodiment of a passivation process 900 that is used to reduce the contamination in subsequently formed layers on subsequently processed substrates 102.

In the first step, or purging step 902, a gas is delivered to the processing region of the processing chamber to remove any undesirable residual contaminants that are disposed in the processing region or on the surface of the chamber components. In one embodiment, the purging step 902 is performed by flowing a purge gas that contains a reactive gas(es), such as hydrogen ($H_2$) gas, into the PECVD process chamber. In one example, the purge gas comprises an inert gas, such as argon.

In one configuration it is also desirable to generate a plasma during the purging step 902 to increase the activity of the reactive gas(es) and energy of the inert gases during processing. The formation of hydrogen containing plasma during the purging step 902 can be effective in removing any undesirable contaminants that are bonded to, or adsorbed on, the chamber surfaces during the previous deposition processes. However, in some embodiments of the passivation process 900, the purging step 902 is optionally required, and thus in some cases the passivation process 900 just comprises the seasoning process 904 discussed below.

In the next step, or seasoning process 904, a passivation layer is disposed on to the surface(s) of the processing chamber components. In one embodiment, the passivation layer is an amorphous silicon layer, which is deposited by flowing an appropriate gas such as silane through the deposition chamber and generating a plasma to deposit the layer of amorphous silicon on the surfaces of the processing chamber components. The passivation layer thus acts as a shield over any residual deposited material that is disposed on the various process chamber components. The passivation layer is generally effective in reducing and/or preventing the contamination of a deposited intrinsic layer due to a left over deposited n-type and/or p-type layers disposed on the chamber components. In one example, the passivation layer is deposited by providing a gas mixture of hydrogen gas to silane gas in a ratio of about 1:20 or less at a chamber pressure between about 0.1 Torr and about 20 Torr. Silane gas may be provided at a flow rate between about 0.5 sccm/L and about 7 sccm/L, and the hydrogen gas may be provided at a flow rate between about 5 sccm/L and about 60 sccm/L. An RF power of between 15 milliWatts/$cm^2$ and about 250 milliWatts/$cm^2$ may be provided to the showerhead. In one example, the passivation layer thickness is greater than about 200 Å. In another example, the passivation layer thickness is greater than about 500 Å. In yet another example, the passivation layer thickness is between about 500 Å and about 1500 Å.

In one embodiment of seasoning process 904, a dopant of a desired type is added to the passivation layer formed during step 904 by the addition of a dopant containing gas that is incorporated into the passivation layer during the deposition process. In some cases it is desirable to dope the passivation layer with a dopant that is of an opposite type to the dopant(s) contained in the one or more layers deposited on the substrate 102 during processing. It is believed that forming the passivation layer with a dopant of an opposite type, such donor or acceptor, the added dopant atoms may neutralize the effect of any residual dopant contamination that left over from a prior substrate deposition process, which could end up in a subsequently deposited intrinsic type layer formed on a substrate. In one example, it is desirable to dope an amorphous silicon passivation layer with boron (B) dopant to neutralize the effect of the residual phosphorous (P) dopant material left over from prior deposition processes. In one embodiment, it is desirable to add a dopant to the seasoning layer formed in the seasoning process 606, discussed above.

In general, the passivation process 900 is performed without a substrate being disposed in the processing region of the processing chamber. However, in some cases during one or more of the passivation process 900 steps a dummy substrate, or a non-usable substrate, is positioned on the substrate support to reduce future substrate contamination and device yield problems. In one example, a dummy substrate is disposed on the substrate supporting surface to prevent deposition of the passivation layer on the substrate supporting surface.

Figure 10:
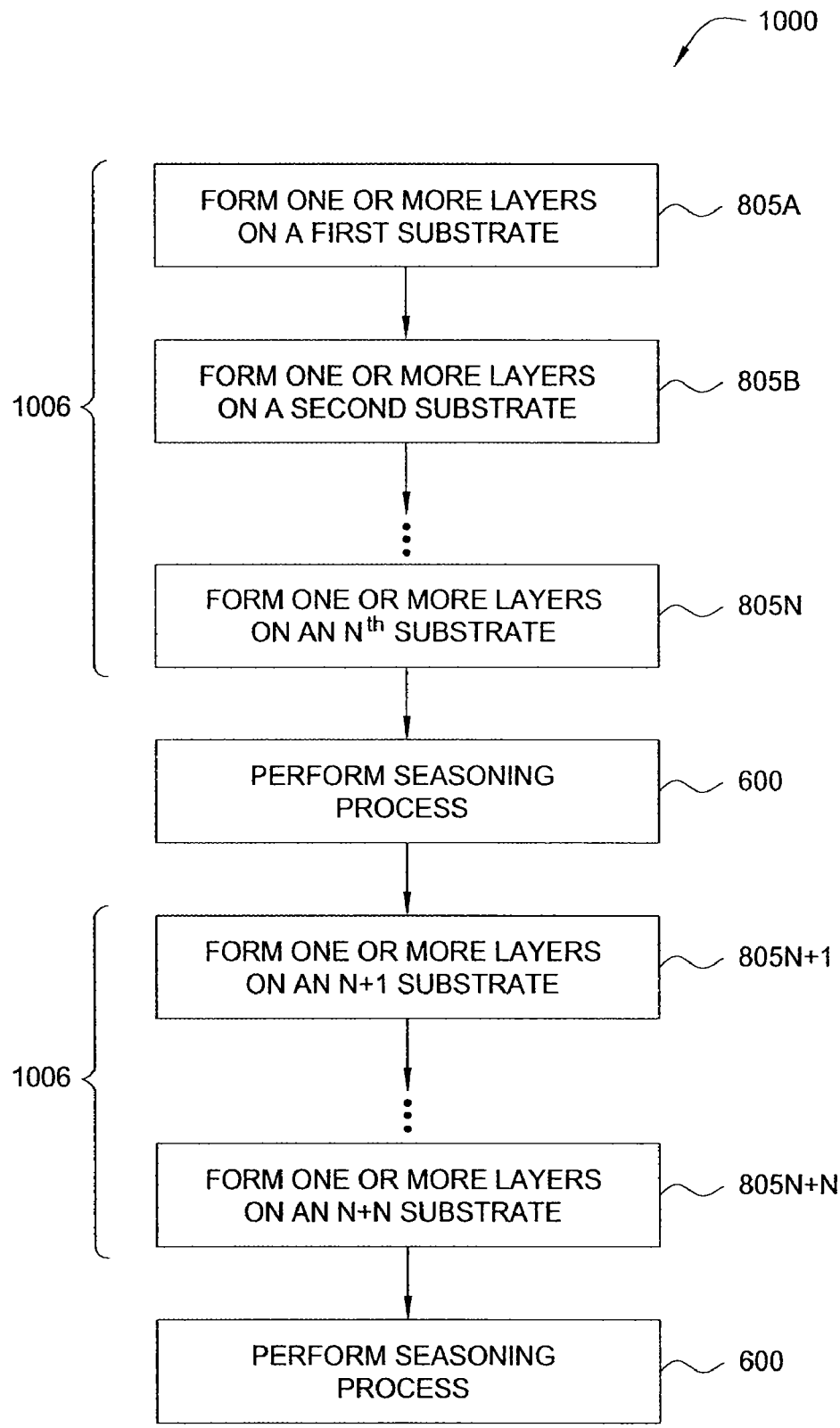
FIG. 10 illustrates a flow chart of a processing sequence performed in a processing chamber in accordance with one embodiment of the present invention.

FIG. 10 illustrates one embodiment of a substrate processing sequence 1000 performed in a processing chamber in which a series of deposition process steps 1006 are performed on a series of substrates and then a seasoning process 600 is performed in the processing chamber. As shown in FIG. 10, the processing sequence 1000 includes forming one or more layers on N number of substrates (e.g., steps 805A-805N) and then performing a seasoning process 600 on the process chamber components, and then forming one or more layers on an additional N number of substrates (e.g., steps 805N+1 to 805N+N) and then performing a second seasoning process 600 on the process chamber components, where N is a desired number of substrates. In one example of the process sequences 1000, each of the deposition process steps in the series of deposition process steps 1006 includes forming a doped layer, such as an n-type or p-type layer, on a substrate. In another example, the each of the deposition process step (e.g., steps 805A-805N) in the series of deposition process steps 1006 include forming a p-type doped layer on a substrate, wherein the frequency with which the seasoning process is performed (i.e., N) is once every 1 to 50 substrates. In yet another example, the frequency with which the seasoning process is performed (i.e. N) in a chamber that is adapted to deposit a p-type doped layer on a substrate is once every 10 to 50 substrates.

Figure 11:
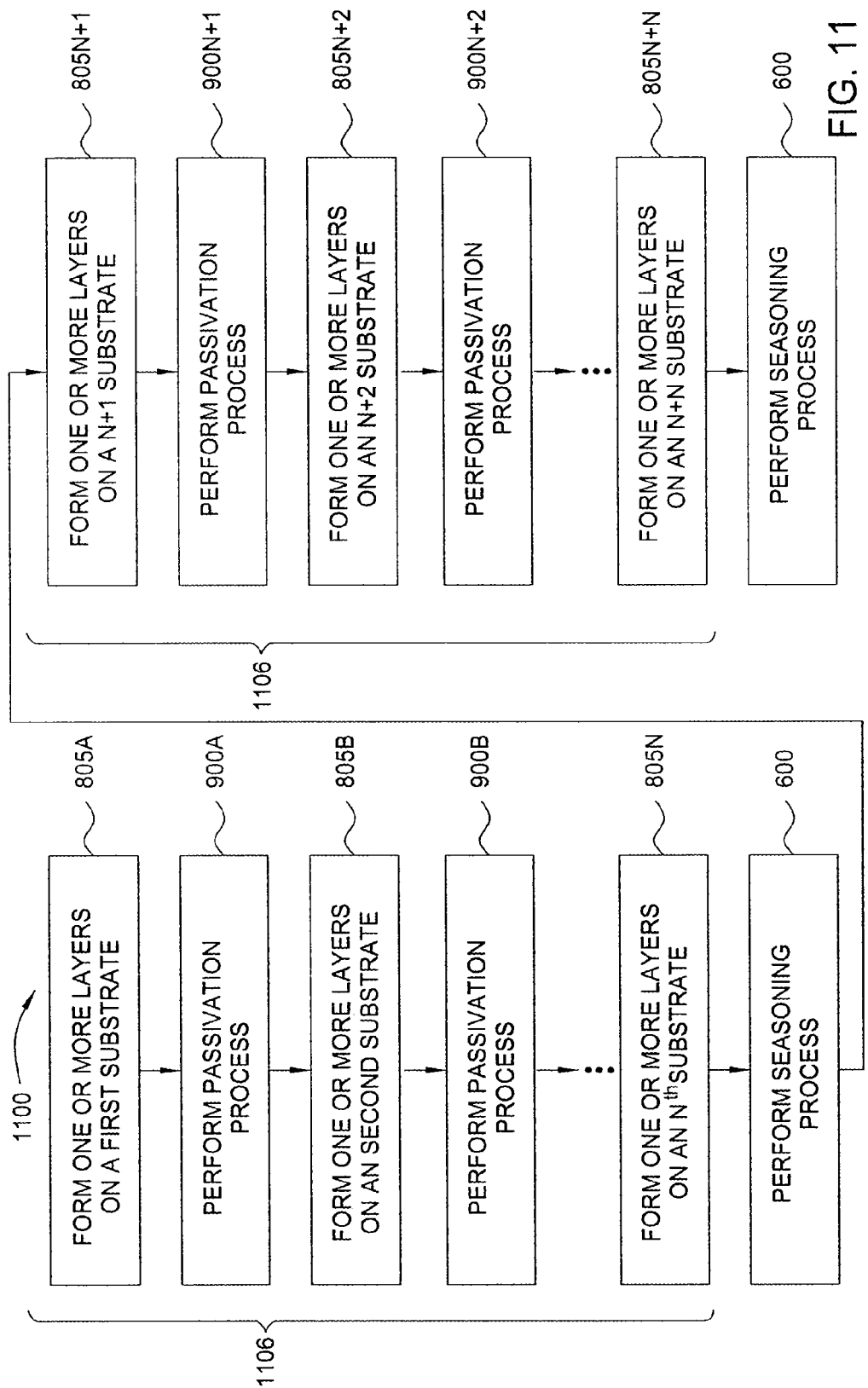
FIG. 11 illustrates a flow chart of a processing sequence performed in a processing chamber in accordance with one embodiment of the present invention.

FIG. 11 illustrates one embodiment of a substrate processing sequence 1100 performed in a processing chamber in which a series of deposition process steps 1106 are performed on a series of substrates and then a seasoning process 600 is performed in the processing chamber. As shown in FIG. 11, the processing sequence 1100 includes forming one or more layers on N number of substrates (e.g., steps 805A-805N) and then performing a seasoning process 600 on the process chamber components, and then forming one or more layers on an additional N number of substrates (e.g., steps 805N+1 to 805N+N) and then performing a second seasoning process 600 on the process chamber components, where N is a desired number of substrates. In one embodiment of the processing sequence 1100, as shown in FIG. 11, it is also desirable to perform a passivation process 900 in between each of the deposition steps in which one or more layers are formed on a substrate (e.g., steps 805A-805N−1, steps 805N+1-805N+N−1). In one embodiment, it is not necessary to perform a passivation process 900 prior to, or after, performing the seasoning process 600 between a pair of substrate deposition steps. For example, as shown in FIG. 11, only a seasoning process 600 is performed after steps 805N and 805 N+N have been completed. In this configuration, the contamination levels in the processing chamber can be reduced and the throughput effect of adding cleaning type process steps after each deposition step to reduce contamination in the deposited layers can be minimized. In general, each of the passivation process steps (e.g., steps 900A, 900B, 900N+1) shown in FIG. 11 are similar to the passivation process 900, which is described above.

In one example of the process sequence 1100, each of the deposition process step (e.g., steps 805A-805N) in the series of deposition process steps 1106 include forming an intrinsic type layer and then forming a doped layer, such as an n-type or p-type layer, on a substrate. In another example, the each of the deposition process step (e.g., steps 805A-805N) in the series of deposition process steps 1106 include forming an intrinsic type layer and then forming an n-type doped layer on a substrate, wherein the frequency with which the seasoning process is performed (i.e., N) is once every 1 to 20 substrates and a passivation process is performed between the other process steps. In yet another example, the frequency with which the seasoning process is performed (i.e., N) in a chamber that is adapted to deposit an intrinsic type layer and then forming an n-type doped layer on a substrate is once every 10 to 20 substrates and a passivation process is performed between the other process steps.

Figure 12:
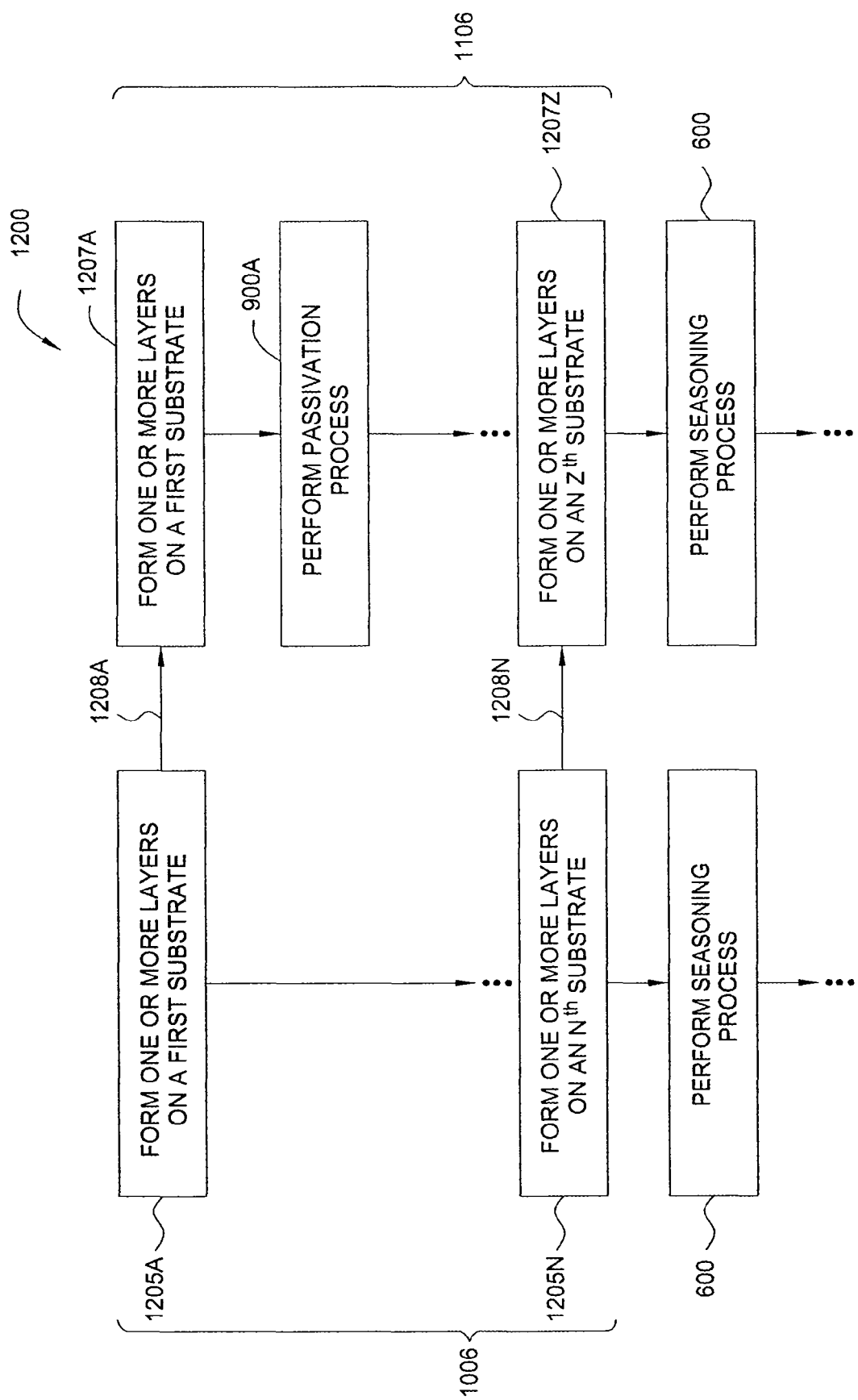
FIG. 12 illustrates a flow chart of a processing sequence performed in a cluster tool in accordance with one embodiment of the present invention.

FIG. 12 illustrates one embodiment of a substrate processing sequence 1200 performed in a cluster tool containing at least two processing chambers in which a series of deposition process steps are performed on a series of substrates and then one or more cleaning type processes (i.e., seasoning process 600 and passivation process 900) is performed in each of the processing chambers at a desirable interval. As shown in FIG. 12, the processing sequence used to form various portions of a device include forming one or more layers in a first processing chamber (e.g., steps 1205A-N) transferring the substrate to a second processing chamber (e.g., steps 1208A-N), and then forming one or more layers in a second processing chamber (e.g., steps 1207A-Z) on the substrate. In one example, the first processing chamber is adapted to perform the deposition process steps 1006 discussed above, and the second process chamber is adapted to perform the deposition process steps 1106 discussed above. In this example, process steps 1205A-1205N are similar to the process steps 805A-805N discussed above in conjunction with FIG. 10, and process steps 1207A-1207Z are similar to the process steps 805A-805N discussed above in conjunction with FIG. 11. The desirable number of substrates that can be processed in the first and second processing chambers before the seasoning process 600 is performed is N substrates and Z substrates, respectively. While FIG. 12 generally illustrates the case where the frequency with which the seasoning process is performed in the first and the second processing chambers are equal (i.e., where N=Z) this configuration are not intended to be limiting as to the scope of the invention described herein. It should be noted that a two chamber substrate process sequencing shown in FIG. 12 is not intended limit the configuration or number of each type of processing chambers that may be contained in a processing system 500 or embodiments of the cleaning process steps discussed herein. The frequency with which the seasoning process is performed in a processing chamber will generally vary with the number of deposition steps performed in a chamber, the amount of material deposited in the chamber, the deposition process parameters, and the type of material deposited in the chamber. As illustrated in FIG. 12 the various processing sequence steps can be repeated a desired number of times or until a desired number of substrates have been processed in the cluster tool.

In certain embodiments of the invention, the processing system 500 is configured to deposit the second p-i-n junction comprising an intrinsic type micro-crystalline silicon layer(s) of a multi-junction solar cell, such as the second p-i-n junction 130 illustrated in FIGS. 1-3. In one configuration, one or more of the process chambers 531-537 are configured to deposit the p-type silicon layer(s) of the second p-i-n junction while the remaining process chambers 531-537 are each configured to deposit both the intrinsic type silicon layer(s) and the n-type silicon layer(s). In certain embodiments, the time to process a substrate with the process chamber to form the p-type silicon layer(s) is approximately 4 or more times faster than the time to form the intrinsic type micro-crystalline silicon layer(s) and the n-type silicon layer(s) in a single chamber. Therefore, in certain embodiments of the system to deposit the second p-i-n junction, the ratio of p-chambers to i/n-chambers is 1:4 or more, preferably 1:6 or more.

Moreover, to increase the substrate throughput of a processing system 500 the frequency with which the seasoning process 600 and/or passivation process 900 are performed and thickness of the deposited layer (e.g., seasoning layer in step 606, passivation layer in step 904) can be optimized. In general, since the seasoning process 600 and passivation process 900 generally cannot be performed concurrently with the deposition process steps performed on the device substrates the time required to perform one or more of these processes will increase the overhead of the process chamber. Therefore, the frequency with which these processes are performed can be selected based on the time it takes to complete the process, the number of chambers in the processing system, the types of chambers positioned within the system, and the deposition process recipe parameters performed in each process chamber, to thus improve the system throughput. As a result, the principles of the present invention described herein will generally provide a high through-put deposition process while controlling the level of contaminants in each of the processing chambers.

Figure 13:
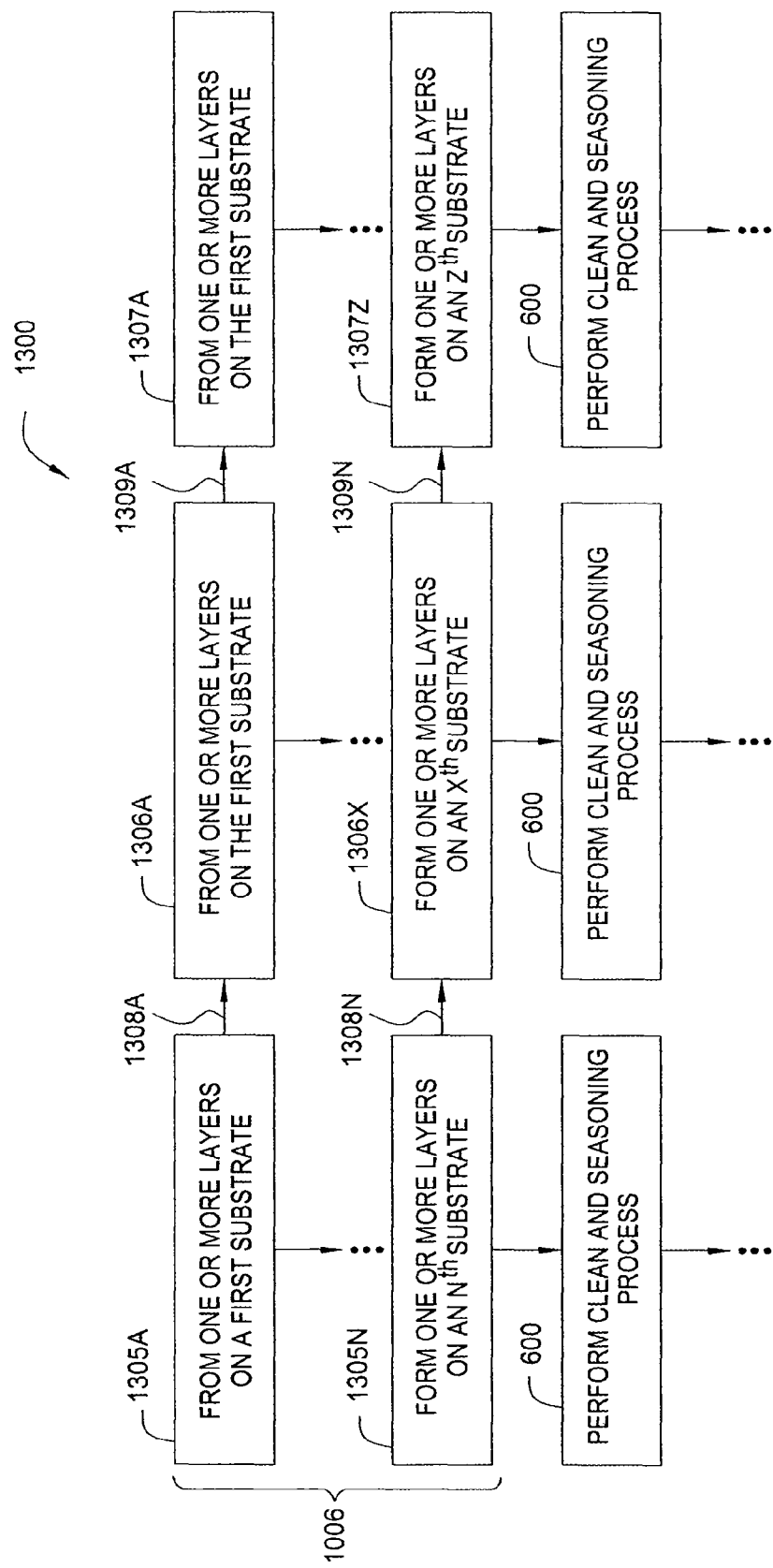
FIG. 13 illustrates a flow chart of a processing sequence performed in a cluster tool in accordance with one embodiment of the present invention.

In certain embodiments, the throughput of the processing system 500 for depositing the first p-i-n junction comprising an intrinsic type amorphous silicon layer is approximately 2 times greater than the throughput of the processing system 500 for depositing the second p-i-n junction comprising an intrinsic type micro-crystalline silicon layer since the thickness of the intrinsic type micro-crystalline silicon layer(s) is thicker than the intrinsic type amorphous silicon layer(s). Therefore, a single processing system 500 adapted to deposit a first p-i-n junction comprising intrinsic type amorphous silicon layer(s) can be matched with two or more systems 500 adapted to deposit a second p-i-n junction comprising intrinsic type microcrystalline silicon layer(s). Once a first p-i-n junction has been formed on one substrate in one system 500, the substrate may be exposed to the ambient environment and transferred to the second system. The seasoning process 600 and/or passivation process 900 described above with regard to the amorphous silicon p-i-n deposition is also applicable to the intrinsic type micro-crystalline silicon layers as described herein. Alternatively, the system as above described and as illustrated in FIG. 5 could also be utilized by dedicating one of the processing chambers to depositing the p-type silicon layer and a second of the chambers dedicated to processing the n-type silicon layers. Under these circumstances, the substrate would be transferred through the transfer chamber 520 to a process chamber, such as process chamber 531, which is dedicated to deposition of the p-type layer. Once the p-type layer has been deposited on the substrate is then transferred by the vacuum robot 522 to a subsequent processing chamber, such as process chambers 532 through 536 for the deposition of an intrinsic layer as described above. Once the intrinsic layer is applied to the p-type layer the substrate is then moved by the vacuum robot 522 to a subsequent process chamber, such as process chamber 537, to deposition of the n-type layer. Under these circumstances, a seasoning process 600, as above described, would generally be required in each of the processing chambers to reduce the contamination found in each processing chamber. FIG. 13 illustrates one embodiment of a substrate processing sequence 1300 performed in a cluster tool containing at least three processing chambers in which a series of three different deposition process steps are performed in each of the processing chambers on a series of substrates and then one or more cleaning type processes (i.e., seasoning process 600 and passivation process 900) are performed in each of the processing chambers at a desirable interval. As shown in FIG. 13, the processing sequence used to form various portions of a device include forming a first layer on a substrate in a first processing chamber (e.g., steps 1305A-N), transferring the substrate to a second processing chamber (e.g., steps 1308A-N), forming a second layer on the substrate in a second processing chamber (e.g., steps 1306A-X), transferring the substrate to a third processing chamber (e.g., steps 1309A-N), and then forming a third layer on the substrate in a third processing chamber (e.g., steps 1307A-Z). The desirable number of substrates that can be processed in the first, second or third processing chambers before the seasoning process 600 is performed is N number of substrates, X number of substrates, and Z number of substrates, respectively. While FIG. 13 generally illustrates the case where the frequency with which the seasoning process is performed in the first, second and third processing chambers are equal (i.e., where N=X=Z) this configuration are not intended to be limiting as to the scope of the invention described herein.

While the foregoing is directed to embodiments of the present invention, other and further embodiments of the invention may be devised without departing from the basic scope thereof, and the scope thereof is determined by the claims that follow.

The invention claimed is:

1. A method of forming an solar cell device on a substrate, comprising:
    depositing two or more layers on a first substrate, wherein depositing the two or more layers comprises:
        forming an intrinsic type layer over a surface of the first substrate in a processing chamber; and
        forming a first doped layer on the intrinsic layer formed on the first substrate;
    passivating a surface of a chamber component disposed in a processing region of the processing chamber after depositing the two or more layers on the first substrate, wherein passivating the surface of the chamber component comprises depositing a passivation layer comprising silicon over the surface of the chamber component;
    depositing two or more layers on a second substrate, wherein depositing the two or more layers comprises:
        forming an intrinsic type layer over a surface of the second substrate in the processing chamber; and
        forming a first doped layer on the intrinsic layer formed on the second substrate; and
    seasoning a surface of the chamber component after depositing the two or more layers on the first and second substrates, wherein seasoning the surface of the chamber component comprises:
        removing an amount of material from the chamber component using a cleaning gas; and
        depositing a seasoning layer comprising silicon over the surface of the chamber component.

2. The method of claim 1, wherein the doped layer comprise a p-type silicon containing layer or an n-type silicon containing layer.

3. The method of claim 1, wherein the passivation layer comprises a p-type or an n-type amorphous silicon containing layer.

4. The method of claim 1, further comprising:
    depositing a second doped layer on the first or the second substrate in an another processing chamber before depositing the intrinsic type layer on the first or the second substrate, wherein the second doped layer comprises dopant atoms that are of an opposite type to the dopant atoms disposed in the first doped layer; and
    seasoning a surface of a chamber component disposed in a processing region of the another processing chamber after depositing the second doped layer on the first or the second substrate, wherein seasoning the surface of the chamber component comprises:
        removing an amount of material from the chamber component disposed in the another processing chamber using a cleaning gas; and depositing a seasoning layer comprising silicon over the surface of the chamber component disposed in the another processing chamber.

5. The method of claim 1, wherein removing an amount of material from the chamber component using a cleaning gas further comprises exposing a surface of the chamber component to a reactive gas and an RF generated plasma, wherein the reactive gas comprises a fluorine containing gas.

6. The method of claim 1, further comprising purging the processing region prior to depositing the two or more layers on the first substrate, wherein purging the processing region comprises forming a hydrogen containing plasma in the processing region.

7. The method of claim 6, wherein purging the processing region is performed after removing an amount of material from the chamber component using a cleaning gas.

8. The method of claim 1, wherein the seasoning layer further comprises an amorphous silicon containing layer.

9. The method of claim 1, further comprising:
depositing two or more layers on a third substrate after depositing the passivation layer over the surface of the chamber component, wherein depositing the two or more layers on the third substrate comprises:
forming an intrinsic type layer over a surface of the third substrate in the processing chamber; and
forming a first doped layer on the formed intrinsic layer in the processing chamber; and
passivating the surface of the chamber component after depositing the two or more layers on the third substrate, and before depositing the two or more layers on the second substrate, wherein passivating the surface of the chamber component comprises depositing a passivation layer comprising silicon over the surface of the chamber component.

10. The method of claim 1, wherein the passivation layer further comprises dopant atoms that are of an opposite type to the dopant atoms disposed in the first doped layer.

11. A method of forming an solar cell device on a substrate, comprising:
processing a plurality of substrates in a first processing chamber, wherein processing a plurality of substrates in the first processing chamber comprises:
depositing a plurality of first layers on a first chamber component and on a plurality of substrates, wherein the first chamber component and one substrate from the plurality of substrates are disposed in the processing region of the first processing chamber when one of the plurality of first layers is deposited on each of the plurality of substrates; and
seasoning a surface of the first chamber component disposed in the processing region of the first processing chamber after the plurality of substrates substrate have processed, wherein seasoning the surface of the first chamber component comprises:
removing an amount of at least a portion of the plurality of first layers deposited on the first chamber component using a cleaning gas; and
depositing a second layer comprising silicon on the surface of the first chamber component; and
processing the plurality of substrates in a second processing chamber, wherein processing the plurality of substrates in the second processing chamber comprises:
depositing one or more third layers on a second chamber component disposed in a processing region of the second processing chamber, and on a first layer formed on each of the plurality of substrates; and
passivating a surface of the second chamber component disposed in the processing region after depositing the one or more third layers, wherein passivating the surface of the second chamber component comprises depositing a fourth layer comprising silicon over the surface of the second chamber component.

12. The method of claim 11, wherein the one or more third layers comprise an intrinsic type silicon containing layer.

13. The method of claim 12, wherein the first layer comprise a p-type silicon containing layer, and the one or more third layers further comprise an n-type silicon containing layer.

14. The method of claim 11, wherein the plurality of substrates processed in the first processing chamber is between about 10 and about 50 substrates.

15. The method of claim 11, wherein seasoning a surface of the first chamber component further comprises purging the processing region of the first processing chamber with a purging gas after removing at least a portion of the plurality of first layers, and before depositing the second layer.

16. The method of claim 15, wherein the purging the processing region comprises forming a hydrogen containing plasma in the processing region.

17. The method of claim 11, wherein the seasoning layer deposited in the first processing chamber or the second processing chamber comprises an amorphous silicon containing layer.

18. A method of forming an solar cell device, comprising:
removing an amount of a deposited material from a surface of a chamber component disposed in a processing region of a first processing chamber;
purging the processing region of the first processing chamber with a purging gas;
positioning a dummy substrate on the substrate support that is positioned within the processing region of the first processing chamber;
depositing a seasoning layer on a surface of the dummy substrate while depositing a seasoning layer over the surface of the chamber component wherein the seasoning layer comprises silicon;
positioning a substrate on a substrate support disposed in the processing region after depositing the seasoning layer on the chamber component; and
depositing one or more layers that is used to form a portion of a solar cell device on a surface of the substrate.

* * * * *